United States Patent
Zou et al.

(10) Patent No.: US 12,406,615 B2
(45) Date of Patent: Sep. 2, 2025

(54) DISPLAY PANEL AND DISPLAY DEVICE

(71) Applicant: Xiamen Tianma Display Technology Co., Ltd., Xiamen (CN)

(72) Inventors: Fenxiang Zou, Xiamen (CN); Jieliang Li, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/103,737

(22) Filed: Jan. 31, 2023

(65) Prior Publication Data
US 2023/0196991 A1    Jun. 22, 2023

(30) Foreign Application Priority Data
Jun. 30, 2022 (CN) .......................... 202210771371.4

(51) Int. Cl.
*G09G 3/32* (2016.01)
(52) U.S. Cl.
CPC ....... *G09G 3/32* (2013.01); *G09G 2310/0243* (2013.01); *G09G 2310/0286* (2013.01)
(58) Field of Classification Search
CPC ............ G09G 3/32; G09G 2310/0243; G09G 2310/0286
See application file for complete search history.

(56) References Cited

U.S. PATENT DOCUMENTS

| | | | | |
|---|---|---|---|---|
| 2004/0256620 A1* | 12/2004 | Yamazaki | ............ | H10K 10/466 257/66 |
| 2014/0111404 A1* | 4/2014 | Omata | ............... | G09G 3/32 345/76 |
| 2015/0301415 A1* | 10/2015 | Sawada | ............ | G02F 1/134336 349/147 |
| 2019/0207163 A1* | 7/2019 | Paek | ...................... | H10K 59/122 |
| 2020/0403131 A1* | 12/2020 | Kim | ...................... | H01L 25/167 |
| 2021/0407426 A1* | 12/2021 | Zeng | ...................... | G11C 19/28 |
| 2022/0013701 A1* | 1/2022 | Ikeda | ...................... | H01L 33/58 |
| 2024/0046872 A1* | 2/2024 | Yang | ...................... | G09G 3/3266 |
| 2024/0049532 A1* | 2/2024 | Li | ............................ | H10K 59/131 |

FOREIGN PATENT DOCUMENTS

| | | |
|---|---|---|
| CN | 113781913 A | 12/2021 |
| CN | 113973506 A | 1/2022 |

* cited by examiner

*Primary Examiner* — Nan-Ying Yang
(74) *Attorney, Agent, or Firm* — KDW FIRM PLLC

(57) ABSTRACT

Provided are a display panel and a display device. The display panel includes a driver circuit, a pixel circuit, a light-emitting element, a first power signal bus, and a second power signal bus. The driver circuit provides a drive signal for the pixel circuit. The pixel circuit provides a drive current for the light-emitting element. The light-emitting element includes a first electrode and a second electrode. The first power signal bus transmits a first power signal V1, the second power signal bus transmits a second power signal V2, and V1≠V2. The first power signal bus is connected to the pixel circuit. The pixel circuit is connected to the first electrode. The second power signal bus is connected to the second electrode. The second power signal bus at least partially overlaps the driver circuit.

18 Claims, 19 Drawing Sheets

DISPLAY PANEL AND DISPLAY DEVICE

CROSS-REFERENCE TO RELATED APPLICATION(S)

This application claims priority to Chinese Patent Application No. 202210771371.4 filed Jun. 30, 2022, the disclosure of which is incorporated herein by reference in its entirety.

TECHNICAL FIELD

Embodiments of the present disclosure relate to the field of display technology and, in particular, to a display panel and a display device.

BACKGROUND

With the development of display technology, a display panel having a narrow bezel and a high screen-to-body ratio becomes more and more popular.

The bezel region of the existing display panel includes a peripheral driver circuit configured to provide a drive signal for a pixel unit in a display region. In a display panel, multiple pixel units are disposed in the display region. Each pixel unit includes a pixel circuit. Each pixel circuit is electrically connected to the peripheral driver circuit in the bezel region separately and provides a scan control signal and a light emission control signal for the pixel circuit through the peripheral driver circuit to control the pixel circuit to provide a drive current for a light-emitting element. However, the existing driver circuit occupies a large space. As a result, it is difficult to further reduce the bezel width of the display panel.

SUMMARY

Embodiments of the present disclosure provide a display panel and a display device.

In a first aspect, the embodiments of the present disclosure provide a display panel. The display pane includes a driver circuit, a pixel circuit, a light-emitting element, a first power signal bus, and a second power signal bus.

The driver circuit provides a drive signal for the pixel circuit. The pixel circuit provides a drive current for the light-emitting element of the display panel.

The light-emitting element includes a first electrode and a second electrode.

The first power signal bus is configured to transmit a first power signal $V1$, the second power signal bus is configured to transmit a second power signal $V2$, and $V1 \neq V2$.

The first power signal bus is connected to the pixel circuit. The pixel circuit is connected to the first electrode. The second power signal bus is connected to the second electrode.

The second power signal bus at least partially overlaps the driver circuit.

In a second aspect, the embodiments of the present disclosure also provide a display device. The display device includes the preceding display panel.

DETAILED DESCRIPTION

Figure 1:
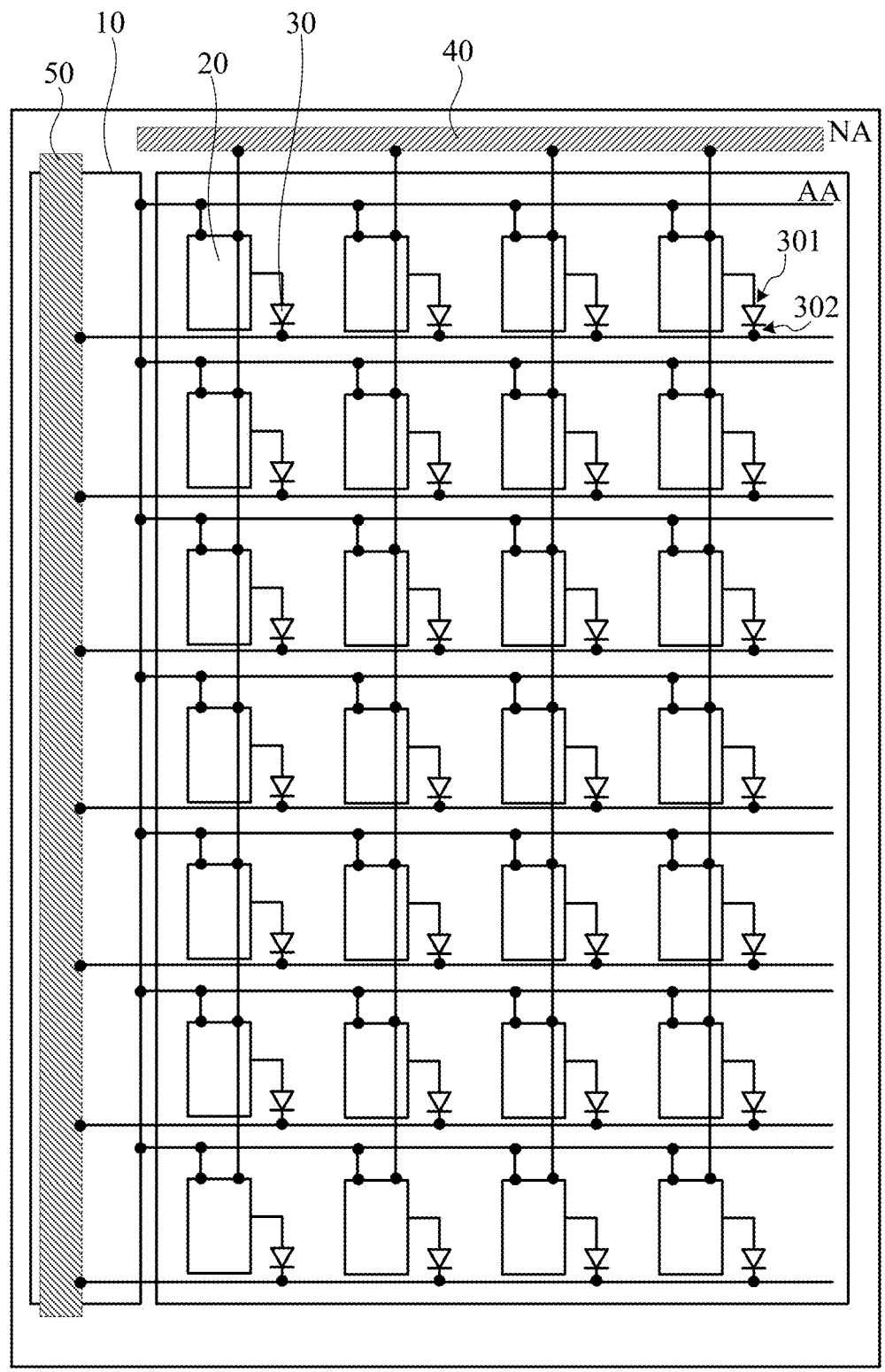
FIG. 1 is a diagram illustrating the structure of a display panel according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

Terms used in the embodiments of the present disclosure are merely used to describe the specific embodiments and not intended to limit the present disclosure. It is to be noted that nouns of locality, including "on", "below", "left" and "right", used in the embodiments of the present disclosure, are described from the angles illustrated in the drawings and are not to be construed as a limitation to the embodiments of the present disclosure. Additionally, in the context, it is to be understood that when an element is formed "on" or "below" another element, the element may be directly formed "on" or "below" another element, or may be indirectly formed "on" or "below" another element via an intermediate element. The terms "first", "second" and the like are merely used for description and used to distinguish between different components rather than indicate any order, quantity, or importance. For those of ordinary skill in the art, the preceding terms can be construed according to specific situations in the present disclosure.

As described in the background, the bezel region of the existing display panel includes a peripheral driver circuit configured to provide a drive signal for a pixel unit in a display region. In a display panel, multiple pixel units are disposed in the display region. Each pixel unit includes a pixel circuit. Each pixel circuit is electrically connected to the peripheral driver circuit in the bezel region separately and provides a scan control signal and a light emission control signal for the pixel circuit through the peripheral driver circuit to control the pixel circuit to provide a drive current for a light-emitting element. However, the existing driver circuit occupies a large space. As a result, it is difficult to reduce the bezel width of the display panel.

In view of this, embodiments of the present disclosure provide a display panel to ensure that the bezel width of the display panel is small. The solution provided by embodiments of the present disclosure is detailed below in conjunction with the drawings.

FIG. 1 is a diagram illustrating the structure of a display panel according to an embodiment of the present disclosure. With reference to FIG. 1, the display panel includes a driver circuit 10, a pixel circuit 20, a light-emitting element 30, a first power signal bus 40, and a second power signal bus 50. The driver circuit 10 provides a drive signal for the pixel circuit 20. The pixel circuit 20 provides a drive current for the light-emitting element 30 of the display panel. The light-emitting element 30 includes a first electrode 301 and a second electrode 302. The first power signal bus 40 is configured to transmit a first power signal V1, the second power signal bus 50 is configured to transmit a second power signal V2, and V1≠V2. The first power signal bus 40 is connected to the pixel circuit 20. The pixel circuit 20 is connected to the first electrode 301. The second power signal bus 50 is connected to the second electrode 302. The second power signal bus 50 at least partially overlaps the driver circuit 10.

The display panel includes a display region AA and a non-display region NA (that is, a bezel region). In the embodiment shown in FIG. 1, the driver circuit 10 is located on a side of the display region AA and drives the pixel circuit 20 in a manner of unilateral driving. The driver circuit 10 and the pixel circuit 2 may be formed by multiple transistors and at least one capacitor. The driver circuit 10 provides the drive signal required for controlling the pixel circuit 20. The pixel circuit 20 controls the light-emitting element 30 to emit light. The light-emitting element 30 may be an organic light-emitting diode (OLED), a sub-millimeter light-emitting diode (Mini LED), or a micro light-emitting diode (Micro LED) and may be selected according to actual situations during the specific implementation. The first electrode 301 may be the anode of the light-emitting element 30. The second electrode 302 may be the cathode of the light-emitting element 30. The first power signal V1 may be an anode voltage signal PVDD. The second power signal V2 may be a cathode voltage signal PVEE. The first power signal bus 40 is generally connected to the pixel circuit 20 through a first power signal line located in the display region AA. The second power signal bus 50 is generally wired in the non-display region NA. The non-display region NA is also generally formed with the driver circuit 10. In this embodiment, to sufficiently save the bezel area, at least part of the region of the second power signal bus 50 may be configured to overlap the driver circuit 10. With this configuration, the bezel of the panel may be saved, and narrow bezel display is implemented. It is to be noted that the overlapping of the second power signal bus 50 and the driver circuit 10 described in this embodiment means that the second power signal bus 50 at least partially overlaps the active layer of at least one transistor in the driver circuit 10 and/or the plate of at least one capacitor in the driver circuit 10. If the second power signal bus 50 merely overlaps the edge wire of the driver circuit 10, there is no overlapping.

It is to be noted that excluding specific provisions, the overlapping described in the present disclosure may generally be regarded as an overlapping relationship in the direction perpendicular to the surface of the display panel. Since the bezel of the display panel mainly refers to the left and right bezels or the upper and lower bezels of the display panel, in the direction perpendicular to the surface of the display panel, the structures overlap with each other to help reduce the bezel area.

In the display panel provided by the embodiments of the present disclosure, the driver circuit provides the drive signal for the pixel circuit, and the pixel circuit provides the drive current for the light-emitting element of the display panel. The first power signal bus is connected to the pixel circuit, and the pixel circuit is connected to the first electrode of the light-emitting element to transmit the first power signal V1 to the first electrode; and the second power signal bus is connected to the second electrode of the light-emitting element to transmit the second power signal V2 to the second electrode. In this manner, the light-emitting element is driven to emit light. The second power signal bus is configured to at least partially overlap the driver circuit, so that the occupied area of the bezel region can be effectively reduced, thereby reducing the bezel width of the display panel.

Figure 2:
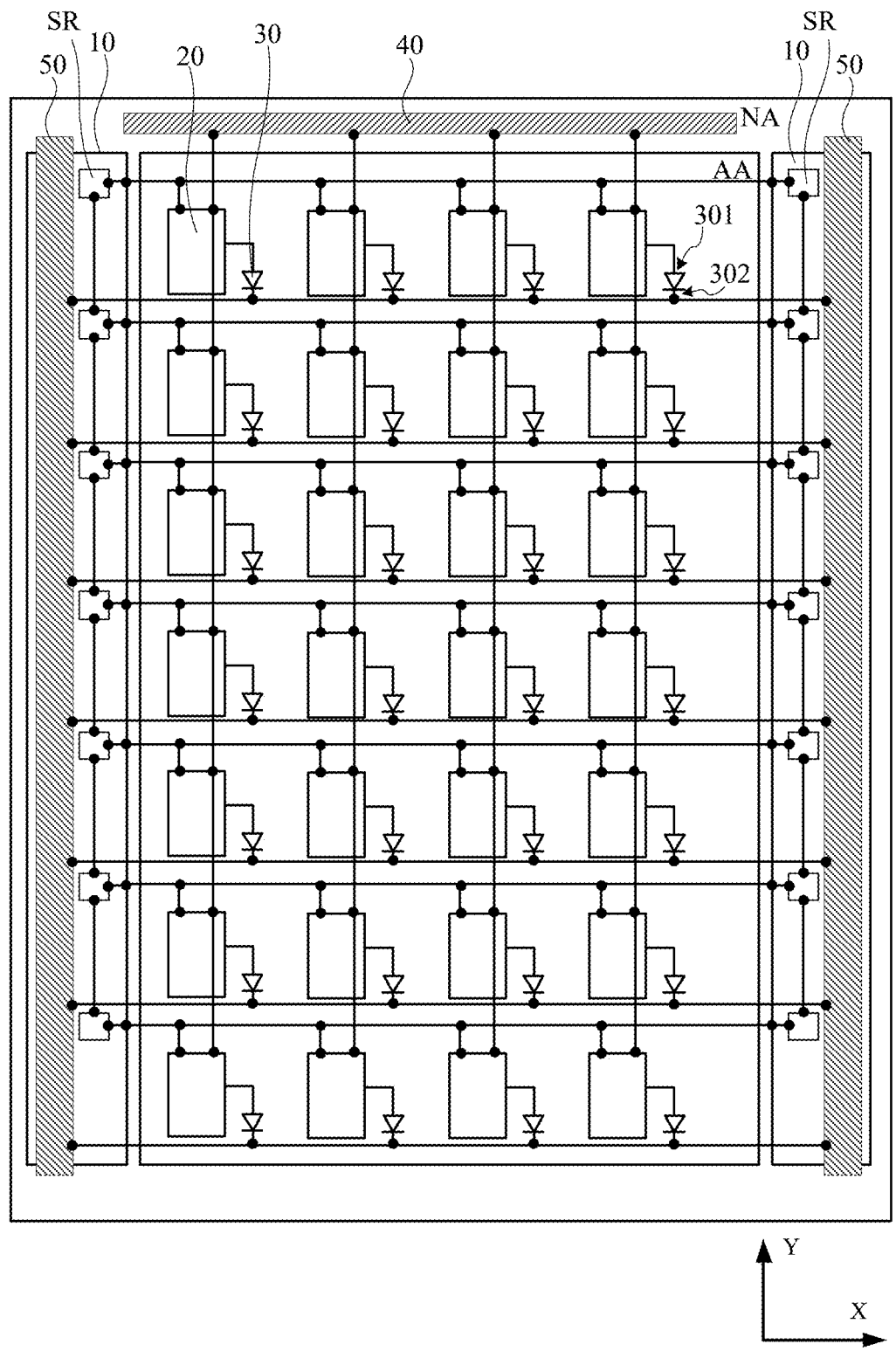
FIG. 2 is a diagram illustrating the structure of another display panel according to an embodiment of the present disclosure.

In the embodiment shown in FIG. 1, the driver circuit 10 is located on the side of the display region AA, and the display panel adopts a display panel structure in a manner of unilateral driving. In another embodiment, the display panel may adopt a display panel structure in a manner of bilateral driving. FIG. 2 is a diagram illustrating the structure of another display panel according to an embodiment of the present disclosure. With reference to FIG. 2, the driver circuit 10 includes a non-display region NA located on two sides of the display region AA, and the pixel circuit 20 is driven by driver circuits 10 on two sides.

As shown in FIG. 2, in the panel structure in a manner of bilateral driving provided by this embodiment of the present disclosure, the pixel circuit 20 of the same row may be driven simultaneously by two driver circuits 10 located on different sides of the display region AA. It is to be understood that each driver circuit 10 includes multiple cascaded shift registers (not shown in FIG. 2). The first stage shift register of the driver circuit 10 of a first side and the first stage shift register of the driver circuit 10 of a second side are each electrically connected to the pixel circuit 20 of the first row. The second stage shift register of the driver circuit 10 of the first side and the second stage shift register of the driver circuit 10 of the second side are each electrically connected to the pixel circuit 20 of the second row. The rest are done in the same manner. The last stage shift register of the driver circuit 10 of the first side and the last stage shift register of the driver circuit 10 of the second side are each electrically connected to the pixel circuit 20 of the last row.

Figure 3:
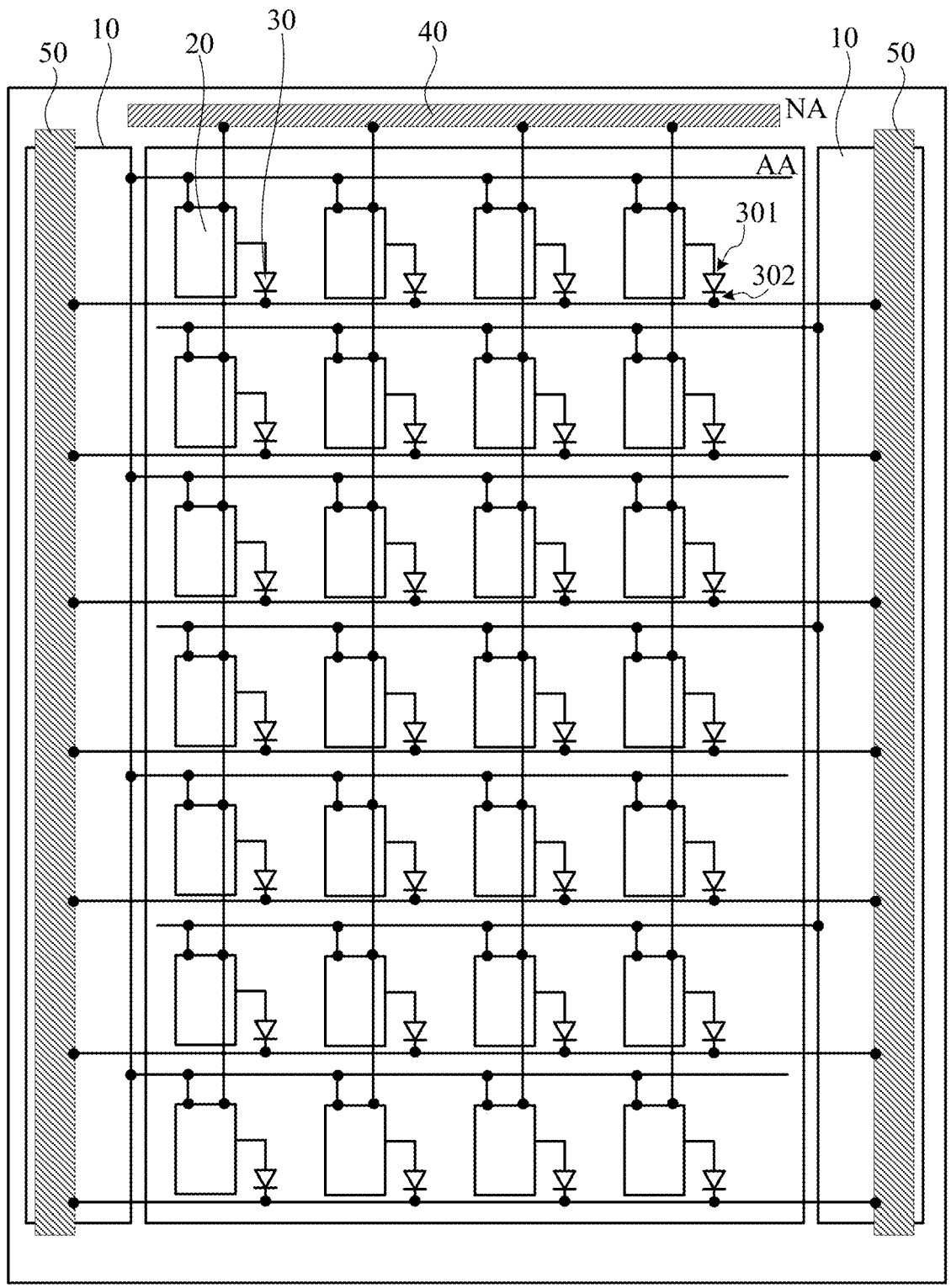
FIG. 3 is a diagram illustrating the structure of another display panel according to an embodiment of the present disclosure.

FIG. 3 is a diagram illustrating the structure of another display panel according to an embodiment of the present disclosure. With reference to FIG. 3, in the panel structure in a manner of bilateral driving provided by this embodiment of the present disclosure, pixel circuits 20 of different rows may be driven simultaneously by two driver circuits 10 located on different sides of the display region AA separately.

It is to be understood that in this embodiment, an odd-numbered stage drive circuit is located on the first side of the display region, and an even-numbered stage driver circuit is located on the second side of the display region. The odd-numbered stage driver circuit is electrically connected to the pixel circuit of a corresponding odd-numbered row. The even-numbered stage driver circuit is electrically connected to the pixel circuits of a corresponding even-numbered row.

Figure 4:
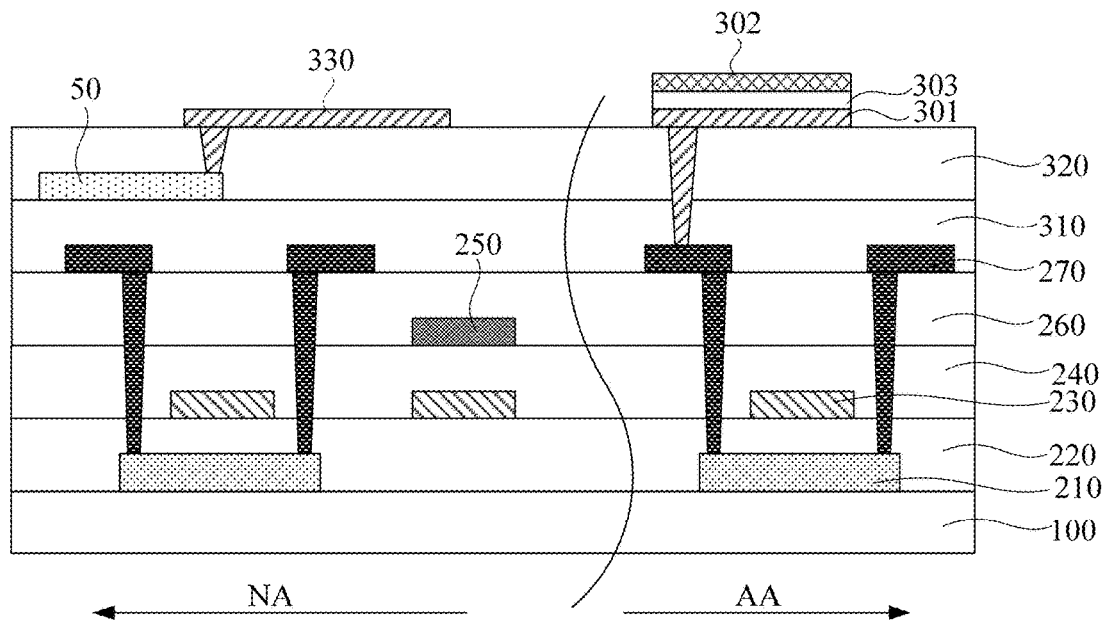
FIG. 4 is a diagram illustrating the structure of another display panel according to an embodiment of the present disclosure.

In an embodiment of the present disclosure, the display panel provided by this embodiment of the present disclosure includes a base substrate. The driver circuit, the pixel circuit, and the light-emitting element are all located on the base substrate. FIG. 4 is a diagram illustrating the structure of another display panel according to an embodiment of the present disclosure. With reference to FIG. 4, the display panel includes a base substrate 100 and a transistor array layer located on the base substrate 100. The transistor array layer includes a semiconductor layer 210 located on the base substrate 100, a gate insulating layer 220 located on the side of the semiconductor layer 210 facing away from the base substrate 100, a gate metal layer 230 located on the side of the gate insulating layer 220 facing away from the base substrate 100, an interlayer insulating layer 240 located on the side of the gate metal layer 230 facing away from the base substrate 100, a capacitor metal layer 250 located on the side of the interlayer insulating layer 240 facing away from the base substrate 100, an isolation layer 260 located on the side of the capacitor metal layer 250 facing away from the base substrate 100, a source and drain metal layer 270 located on the side of the isolation layer 260 facing away from the base substrate 100, and a first insulating layer 310 and a second insulating layer 320 located on the side of the source and drain metal layer 270 facing away from the base substrate 100. The semiconductor layer 210 includes multiple active regions. The gate metal layer 230 includes multiple gates and multiple first capacitor plates. The capacitor metal layer 250 includes a second capacitor plate that is disposed opposite to and overlaps the first capacitor plates. The source and drain metal layer 270 includes multiple sources and drains. The sources and the drains are in contact with and connected to the active regions through their corresponding vias. The transistor array layer includes a pixel circuit and a driver circuit. In the display region AA, a first electrode 301, a light-emitting layer 303, and a second electrode 302 are disposed on the side of the second insulating layer 310 facing away from the base substrate 100. In the non-display region NA, the second power signal bus 50 is disposed on the side of the first insulating layer 310 facing away from the base substrate 100.

With continued reference to FIG. 4, optionally, the display panel also includes an auxiliary connection layer 330. The auxiliary connection layer 330 is located between the film where the second electrode 302 is located and the film where the second power signal bus 50 is located. The auxiliary connection layer 330 is connected to the second electrode 302 and the second power signal bus 50.

It is to be understood that in this embodiment, the second electrode 302 is the cathode of the light-emitting element, and the film of the second electrode 302 is located on the top of the light-emitting element. The second power signal bus 50 is a metal wire disposed in the transistor array layer and is located inside the transistor array layer. In this manner, the distance between the second electrode 302 and the second power signal bus 50 is large. If the second electrode 302 is directly connected to the second power signal bus 50, a deep via is required. As a result, the connection effect may be poor. In this embodiment of the present disclosure, the auxiliary connection layer 330 is disposed. The second power signal bus 50 is connected to the auxiliary connection layer 330 first, and then the auxiliary connection layer 330 is connected to the second electrode 302 (FIG. 4 is a diagram illustrating the structure of part of the display region AA and part of the non-display region NA, so the connection relationship between the auxiliary connection layer 330 and the second electrode 302 is not shown in the figure). The auxiliary connection layer 330 plays the role of an intermediate transition. In this manner, a good connection can be ensured, and a resistance can be reduced. Optionally, the auxiliary connection layer 330 is located in the same layer as the first electrode 301.

In this embodiment, the film where the first electrode (the anode of the light-emitting element) 301 is located between the second power signal bus 50 and the second electrode 302. The auxiliary connection layer 330 is configured to be located in the same layer as the first electrode 301. In this manner, the process can be simplified, and the preparation cost of the display panel can be reduced. In other embodiments, the auxiliary connection layer 330 may be located in another film between the second power signal bus 50 and the second electrode 302 and may be designed according to actual situations during the specific implementation.

Figure 5:
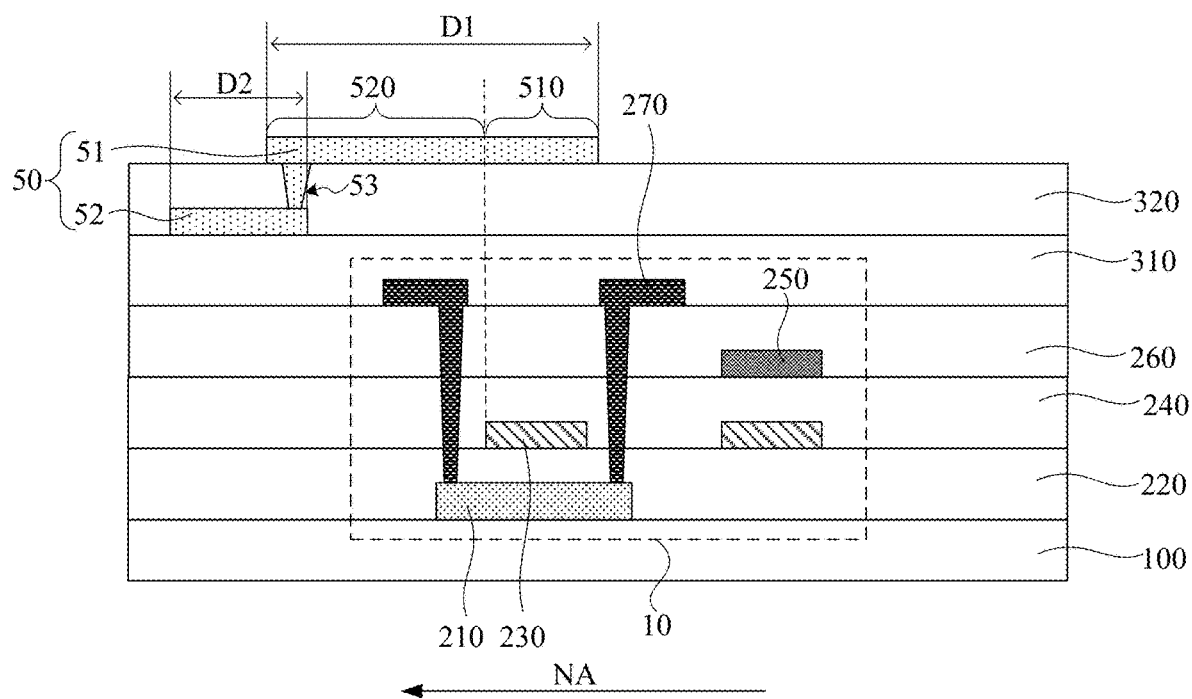
FIG. 5 is a diagram illustrating the structure of another display panel according to an embodiment of the present disclosure.

FIG. 5 is a diagram illustrating the structure of another display panel according to an embodiment of the present disclosure. With reference to FIG. 5, optionally, the second power signal bus 50 includes a first sub-signal line 51 and a second sub-signal line 52. The first sub-signal line 51 and the second sub-signal line 52 are disposed in different layers. The first sub-signal line 51 is connected to the second sub-signal line 52 through a first via 53.

The function of the second power signal bus 50 is to provide the second power signal V2 for the second electrode (the structure of the display region is not shown in FIG. 5). The voltage drop on the second power signal bus 50 may cause the signal on the second electrode to be inaccurate, thereby causing the brightness of the light-emitting element to be inconsistent with expected display brightness. To avoid this problem, it is necessary to reduce the resistance of the second power signal bus 50 as much as possible to ensure that the voltage drop on the second power signal bus 50 is small, so that the brightness of the light-emitting element is as accurate as possible. Moreover, to implement the effect of a narrow bezel, a single-layer wire cannot be configured to be too wide. On this basis, in this embodiment, the second power signal bus 50 is configured to include a first sub-signal line 51 and a second sub-signal line 52 disposed in different layers. The two wires are electrically connected to reduce the resistance on the second power signal bus 50. In this manner, the voltage drop on the second power signal bus 50 is reduced, and the display effect is improved.

With continued reference to FIG. 5, optionally, the first sub-signal line 51 at least partially overlaps the driver circuit 10. The second sub-signal line 52 does not overlap the driver circuit 10. The width D1 of the first sub-signal line 51 is larger than the width D2 of the second sub-signal line 52.

In an embodiment, the first sub-signal line 51 may be configured to at least partially overlap the driver circuit 10. The second sub-signal line 52 may be configured not to overlap the driver circuit 10. In this manner, a factor such as the design width of the first sub-signal line 51 is increased to sufficiently reduce the voltage drop on the second sub-signal line 52 through the first sub-signal line 51 without additionally increasing the bezel area of the display panel. That is, the width D1 of the first sub-signal line 51 is configured to be larger than the width D2 of the second sub-signal line 52, so that a large voltage drop on the second power signal bus 50 may be avoided without increasing the bezel area. It is to be noted that only the structure of the non-display region NA is shown in FIG. 5, where the arrow is directed from the display region to the edge of the display panel. The representation in the following embodiments is the same.

Figure 6:
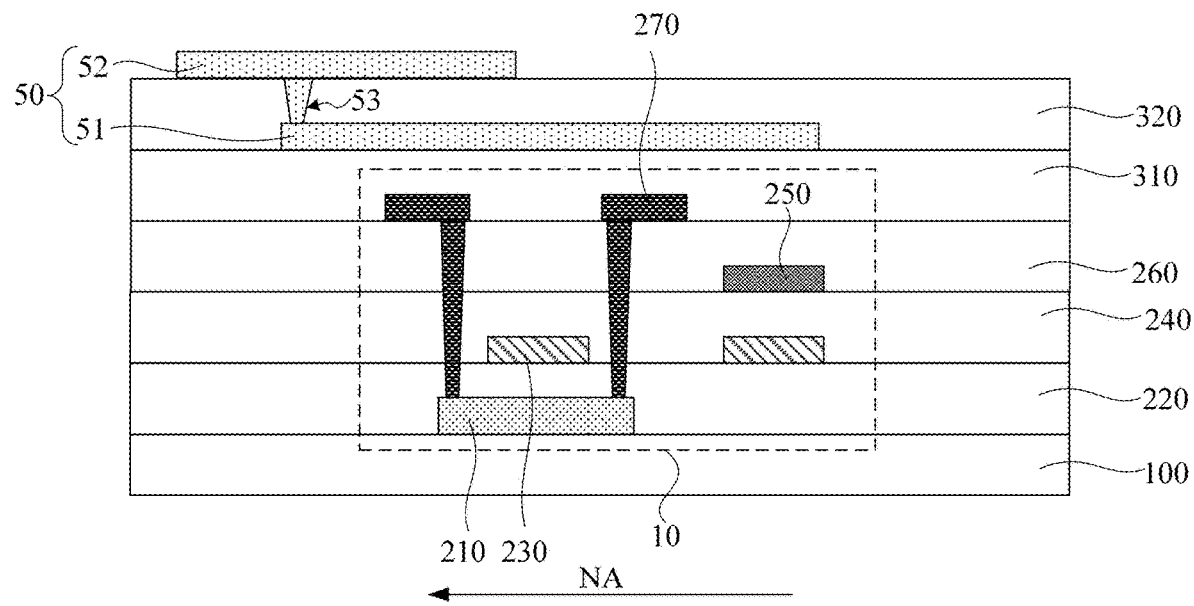
FIG. 6 is a diagram illustrating the structure of another display panel according to an embodiment of the present disclosure.

In another embodiment, the first sub-signal line and the second sub-signal line may also be each configured to overlap the driver circuit. For example, FIG. 6 is a diagram illustrating the structure of another display panel according to an embodiment of the present disclosure. With reference to FIG. 6, optionally, the first sub-signal line 51 overlaps the driver circuit 10. The second sub-signal line 52 also overlaps the driver circuit 10. The first sub-signal line 51 and the second sub-signal line 52 are each located between the film where the first electrode (the structure of the display region is not shown in FIG. 6) is located and the film where the driver circuit 10 is located. The first sub-signal line 51 and the second sub-signal line 52 are each configured to overlap the driver circuit 10. In this manner, it is beneficial to minimize the width of the bezel region. During specific implementation, the size of the overlapping region of the first sub-signal line 51 and the second sub-signal line 52 may be configured according to actual situations. This is not limited in this embodiment of the present disclosure.

With continued reference to FIG. 5, optionally, the first sub-signal line 51 includes a first region 510 and a second region 520. The first region 510 overlaps the driver circuit 10. The second region 520 does not overlap the driver circuit 10. The second region 520 is located on the side of the first region 510 facing away from the display region of the display panel. The second region 520 overlaps the second sub-signal line 52. The second region 520 is connected to the second sub-signal line 52 through the first via 53. The first via 53 does not overlap the driver circuit 10.

The first sub-signal line 51 is extended towards the side facing away from the display region of the display panel to form the second region 520, and the second region 520 is connected to the second sub-signal line 52 through the first via 53. In this manner, the first via 53 does not overlap the driver circuit 10, thereby avoiding the influence of a via region on the driver circuit 10 in the process.

Figure 7:
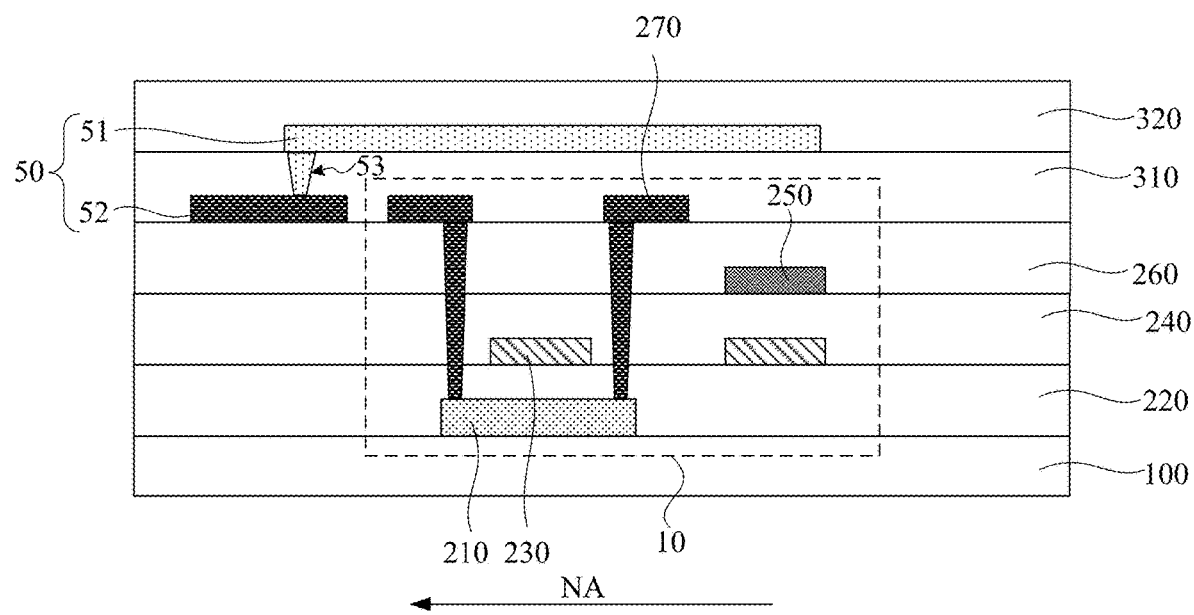
FIG. 7 is a diagram illustrating the structure of another display panel according to an embodiment of the present disclosure.

FIG. 7 is a diagram illustrating the structure of another display panel according to an embodiment of the present disclosure. With reference to FIG. 7, optionally, the first sub-signal line 51 is located on the side, facing the driver circuit 10, of the film where the first electrode is located. The second sub-signal line 52 is located on the side, facing the driver circuit 10, of the film where the first sub-signal line 51 is located. The driver circuit includes a first transistor and/or a first capacitor (one transistor and one capacitance are schematically shown in FIG. 7). At least one film of the first transistor is located in the same layer as the second sub-signal line 52. Moreover/Alternatively, at least one plate of the first capacitor is located in the same layer as the second sub-signal line 52.

It is to be understood that the case where the second sub-signal line 52 is in the same layer as the source and drain metal layer 270 shown in FIG. 7 is merely schematic. In other embodiments, the second sub-signal line may be disposed in the same layer as the gate metal layer 230 (a first plate of the capacitor) and may also be disposed in the same layer as the capacitor metal layer 250, or may be disposed in the same layer as another wire film in a driver circuit layer. Flexible selection may be performed according to actual situations during the specific implementation. In this embodiment, since the second sub-signal line 52 does not overlap the driver circuit 10, the second sub-signal line 52 is disposed in the same layer as some films in the driver circuit 10, thereby simplifying the process. In other embodiments, in the case where circuit design conditions permit, the second power signal bus may be configured to include three or more films connected in parallel to reduce the resistance of the second power signal bus and the voltage drop during signal transmission. This is not limited in this embodiment of the present disclosure.

Figure 8:
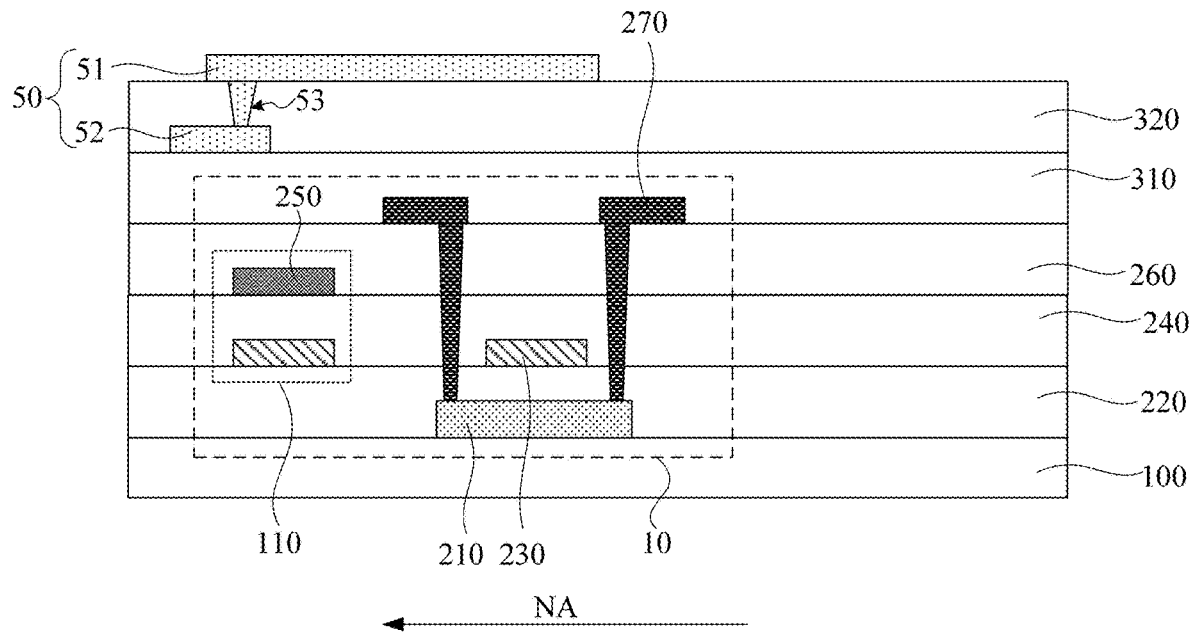
FIG. 8 is a diagram illustrating the structure of another display panel according to an embodiment of the present disclosure.

FIG. 8 is a diagram illustrating the structure of another display panel according to an embodiment of the present disclosure. With reference to FIG. 8, optionally, the first sub-signal line 51 is located on the side of the second sub-signal line 52 facing the film where the first electrode is located. The width of the first sub-signal line 51 is larger than the width of the second sub-signal line 52.

In this embodiment, the second sub-signal line 52 is more adjacent to the driver circuit 10 than the first sub-signal line 51. If the width of the second sub-signal line 52 is configured to be too large, the signal crosstalk between the second sub-signal line 52 and the driver circuit 10 caused by coupling action may increase. While the first sub-signal line 51 is farther from the driver circuit 10 than the second sub-signal line 52, and the signal crosstalk between the first sub-signal line 51 and the driver circuit 10 is small. Accordingly, the width of the first sub-signal line 51 may be appropriately increased to be larger than the width of the second sub-signal line 52, thereby sufficiently reducing the voltage drop.

With continued reference to FIG. 8, optionally, the driver circuit 10 includes a first capacitor 110. The overlapping area of the first sub-signal line 51 and the first capacitor 110 is S1, and the overlapping area of the second sub-signal line 52 and the first capacitor 110 is S2, where $S1 > S2 \geq 0$.

When the second power signal bus 50 overlaps the first capacitor 110, parasitic capacitance may be formed. As a result, the capacitance is unstable, thereby affecting the performance of the driver circuit 10. To avoid the occurrence of the parasitic capacitance as much as possible, in this embodiment, the overlapping area S1 of the first sub-signal line 51 and the capacitor is configured to be larger than the overlapping area S2 of the second sub-signal line 52 and the capacitor. In this manner, the additional capacitance generated between the second sub-signal line 52 and the capacitor may be reduced as much as possible. While the first sub-signal line 51 is farther from the driver circuit 10 than the second sub-signal line 52, thus the value of the parasitic capacitance generated is small.

Figure 9:
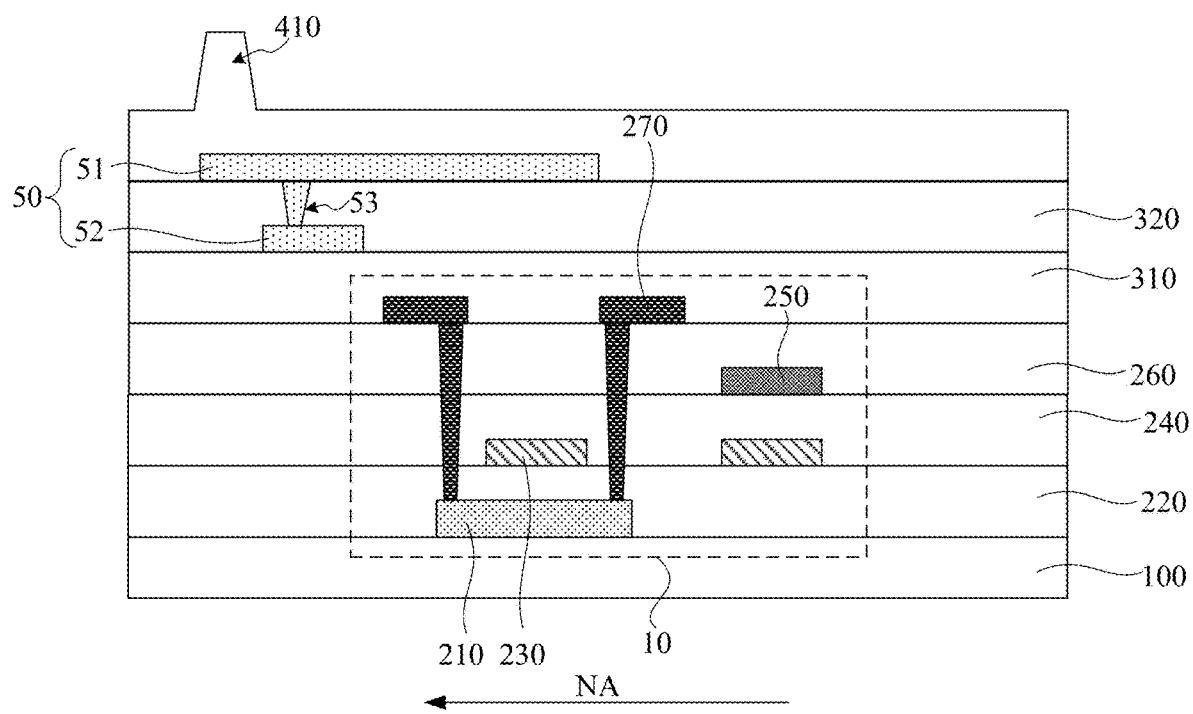
FIGS. 9 to 11 are each a diagram illustrating the structure of another display panel according to an embodiment of the present disclosure.
Figure 10:
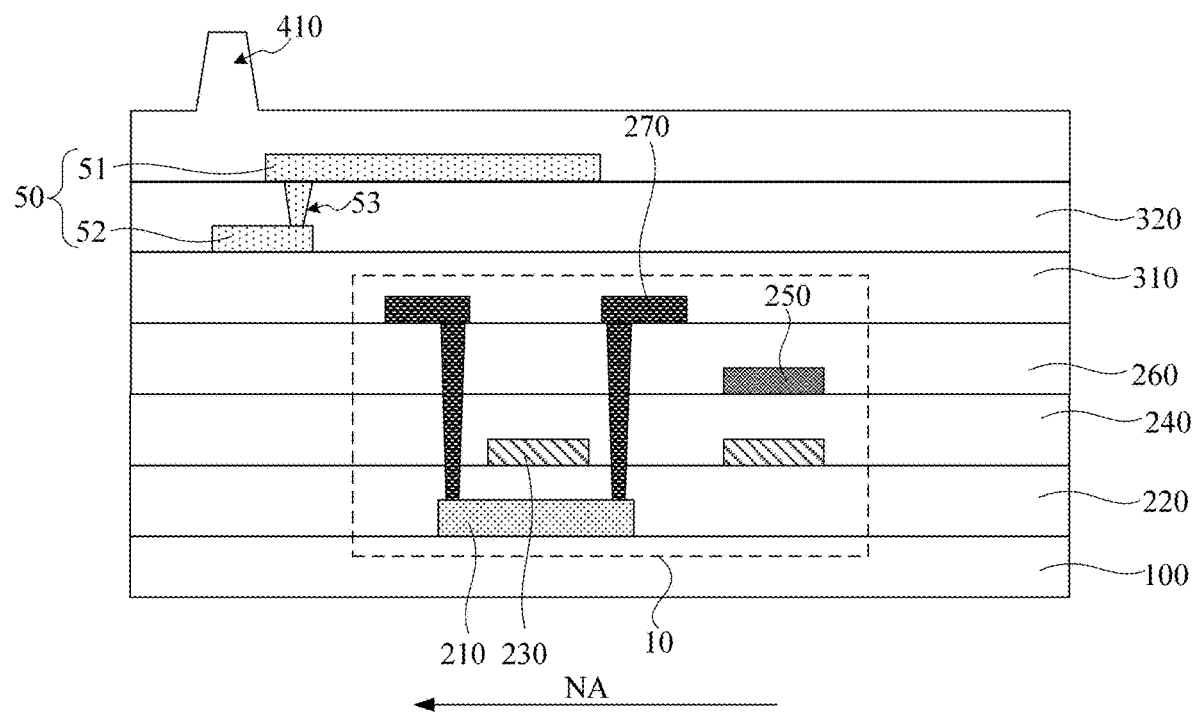
Figure 11:
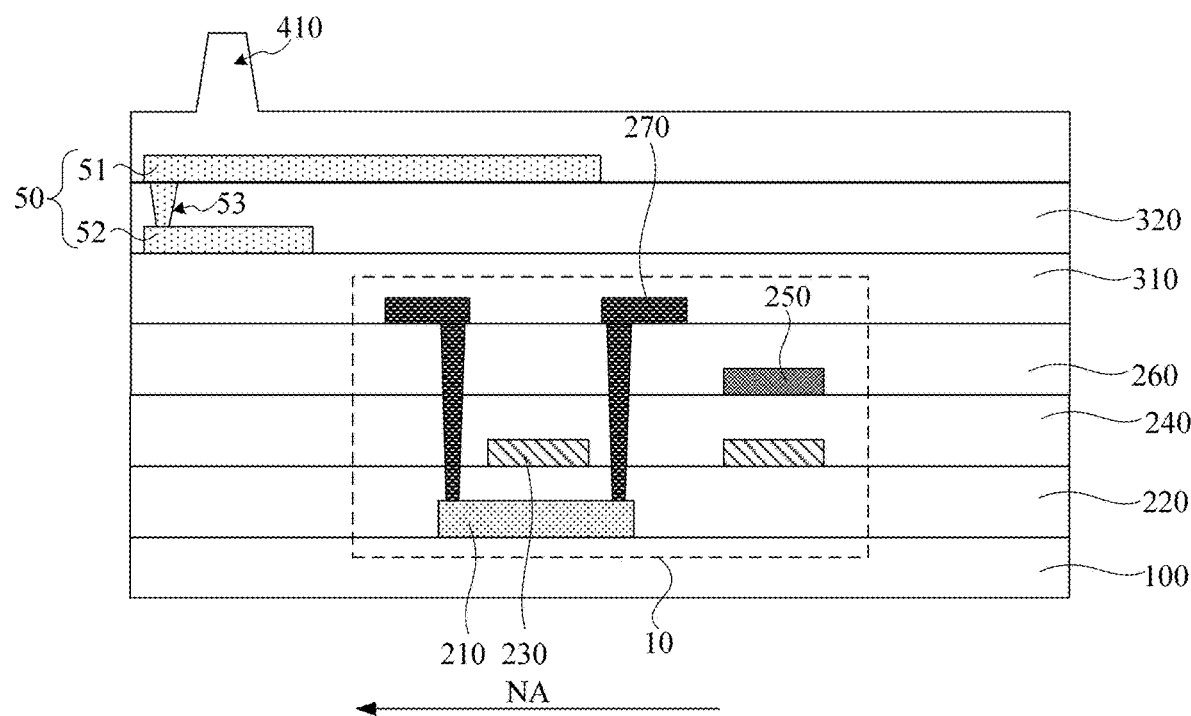

FIGS. 9 to 11 are each a diagram illustrating the structure of another display panel according to an embodiment of the present disclosure. With reference to FIGS. 9 to 11, optionally, the display panel includes a first bank 410 located on the side of the driver circuit 10 facing away from the display region of the display panel. The first bank 410 overlaps at least one of the first sub-signal line 51 and the second sub-signal line 52.

The light-emitting layer material of the light-emitting element is sensitive to external substances such as water and oxygen. When the light-emitting layer is invaded by external water and oxygen, the light-emitting layer fails, thereby affecting the display effect. To protect the light-emitting layer, a multi-layer stacked encapsulation layer is generally disposed. In this embodiment, the first bank 410 is disposed in the non-display region. The first bank 410 may cut off part of the encapsulation layer (for example, an organic layer, the structure of the encapsulation layer is shown in the figure), and the others of the encapsulation layer (for example, an inorganic layer) cover the first bank 410 to improve the encapsulation effect. With reference to FIG. 9, the first bank 410 overlaps the first sub-signal line 51. With reference to FIG. 10, the first bank 410 overlaps the second sub-signal line 52. With reference to FIG. 11, the first bank 410 overlaps the first sub-signal line 51 and the second sub-signal line 52. The first bank 410 is configured to overlap at least one of the first sub-signal line 51 and the second sub-signal line 52, so that the space occupied by the bezel may be reduced as much as possible, thereby implementing the effect of a narrow bezel.

Optionally, the first via 53 does not overlap the first bank 410. With reference to FIG. 9 or 10, the first via 53 is located between the driver circuit 10 and the first bank 410. Alternatively, with reference to FIG. 11, the first via 53 is located on the side of the first bank 410 facing away from the driver circuit 10.

Since the first bank 410 is responsible for cutting off at least part films of the encapsulation layer of the display panel, it is generally required that the first bank 410 portion preferably does not have a structure such as a valley. However, if a via position is disposed below the bank, a valley may appear below the bank. For this reason, the first via 53 is configured not to overlap the first bank 410. On this basis, the first via 53 may be located between the driver circuit 10 and the first bank 410 (FIG. 9 and FIG. 10). Alternatively, the first via 53 is located on the side of the first bank 410 facing away from the driver circuit 10 (FIG. 11).

Figure 12:
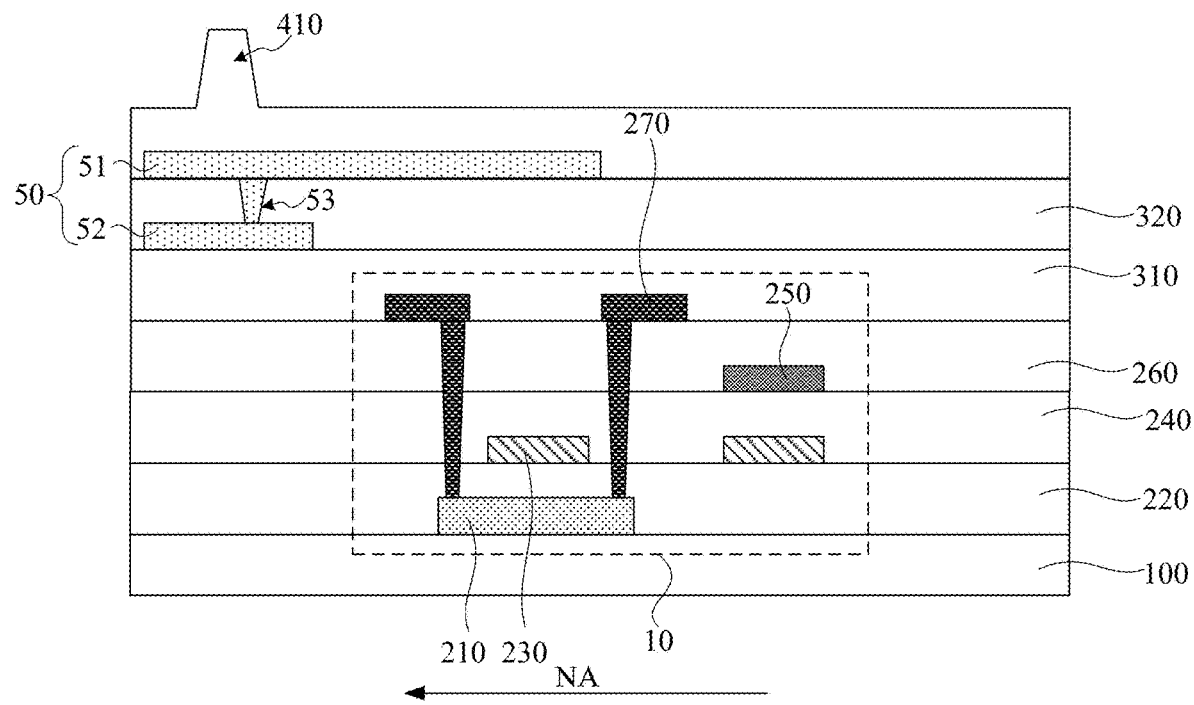
FIG. 12 is a diagram illustrating the structure of another display panel according to an embodiment of the present disclosure.

FIG. 12 is a diagram illustrating the structure of another display panel according to an embodiment of the present disclosure. With reference to FIG. 12, since the first via 53 is a via connecting the first sub-signal line 51 and the second sub-signal line 52, to avoid the influence of the via on the driver circuit 10, the first via 53 is generally configured not to overlap the driver circuit 10. To sufficiently save the bezel space, in this embodiment, the first bank 410 is configured to at least partially overlap the first via 53. The position of the first via 53 is merely schematic and may be selected according to actual situations during the specific implementation. This is not limited in this embodiment of the present disclosure.

Figure 13:
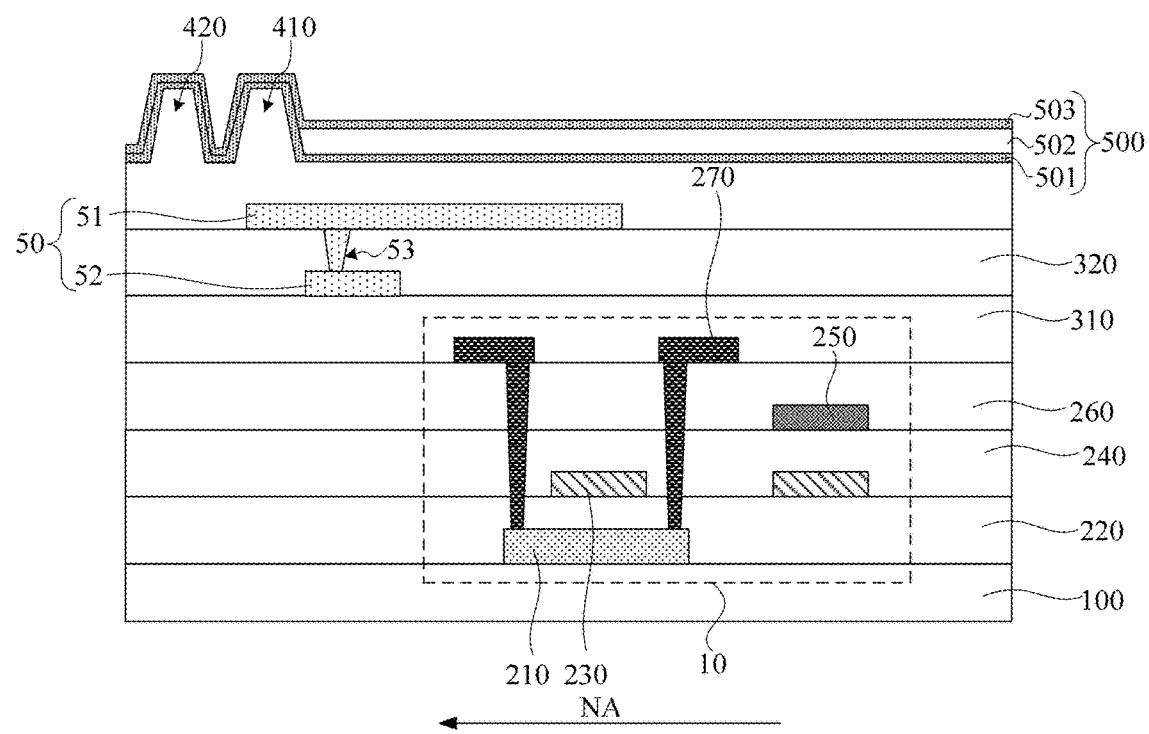
FIG. 13 is a diagram illustrating the structure of another display panel according to an embodiment of the present disclosure.

FIG. 13 is a diagram illustrating the structure of another display panel according to an embodiment of the present disclosure. With reference to FIG. 13, optionally, the display panel also includes an encapsulation layer 500 and a second bank 420. FIG. 13 schematically shows that the encapsulation layer 500 includes a first inorganic layer 501, an organic layer 502, and a second inorganic layer 503. At least one film (the organic layer 502) of the encapsulation layer 500 is cut off at the first bank 410. The second bank 420 is located on the side of the first bank 410 facing away from the display region of the display panel.

In the preparation process of the encapsulation layer 500, before the film is formed, the organic layer is generally in a flowable liquid form, so it is necessary to design a bank structure to cut off. The inorganic layer generally adopts a process such as deposition and may cover the second bank 420. The encapsulation effect can be further improved through a multi-bank structure, and the performance of the display panel can be improved.

Figure 14:
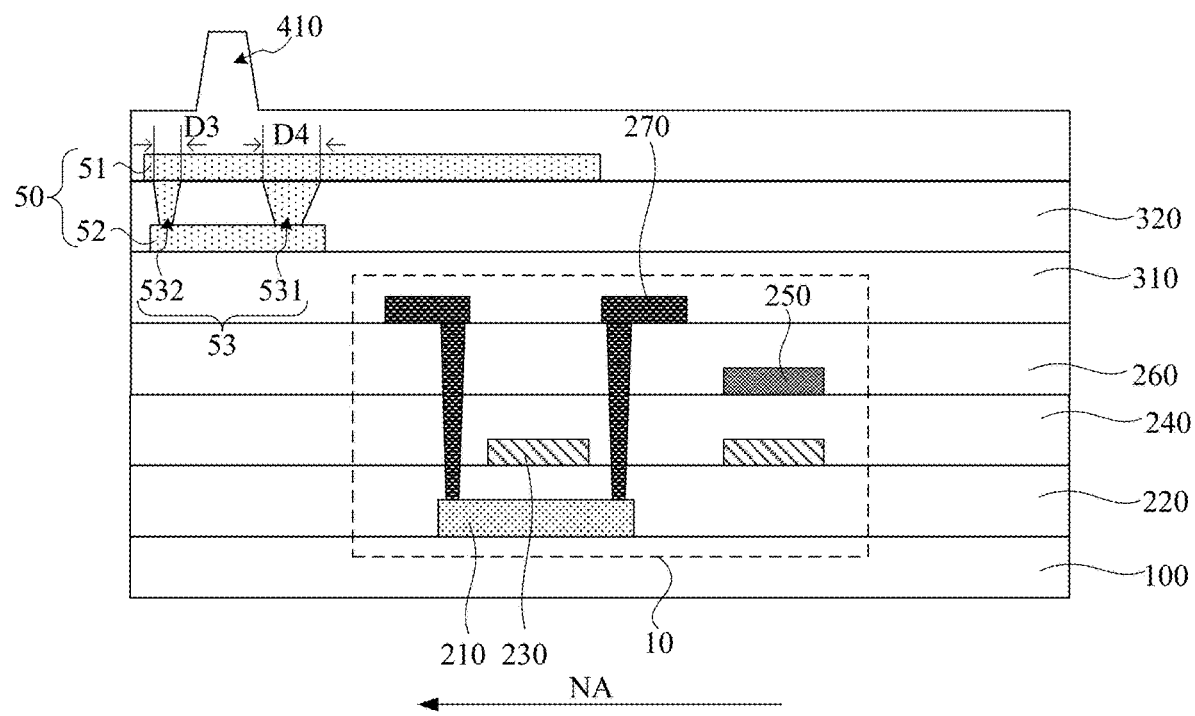
FIG. 14 is a diagram illustrating the structure of another display panel according to an embodiment of the present disclosure.

FIG. 14 is a diagram illustrating the structure of another display panel according to an embodiment of the present disclosure. With reference to FIG. 14, optionally, the first via 53 includes a first sub-via 531 and a second sub-via 532. The first sub-via 531 is located between the driver circuit 10 and the first bank 410. The second sub-via 532 is located on the side of the first bank 410 facing away from the driver circuit 10.

To improve the electrical connection stability between the first sub-signal line 51 and the second sub-signal line 52, more than one via may be configured to increase the contact area of the two.

For example, in the embodiment of FIG. 14, two vias may be disposed between the first sub-signal line 51 and the second sub-signal line 52, and the two vias may be located on two sides of the first bank 410 separately. In other embodiments, the two vias may also be configured to be located on one side of the first bank 410. Alternatively, more vias may be disposed according to actual conditions. A design may be performed according to actual situations during the specific implementation.

With continued reference to FIG. 14, optionally, the width D3 of the first sub-via 531 is larger than the width D4 of the second sub-via 532.

In this embodiment, the first sub-via 531 is located on the side of the first bank 410 adjacent to the display region, that is, the first sub-via 531 is disposed more adjacent to the inner side of the display panel than the second sub-via 532. This part is farther from the edge in the display panel and can be well encapsulated and protected. Accordingly, the width of the first sub-via 531 is configured to be large. In this manner, on the basis of ensuring the communication performance of the first sub-signal line 51 and the second sub-signal line 52, the probability of process defects of the display panel can be reduced.

Figure 15:
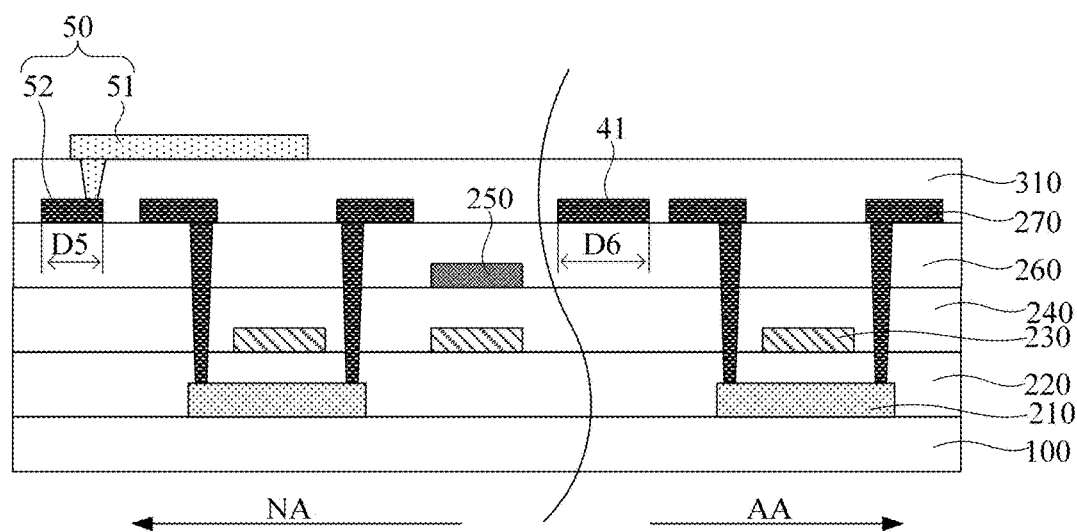
FIGS. 15 and 16 are each a diagram illustrating the structure of another display panel according to an embodiment of the present disclosure.
Figure 16:
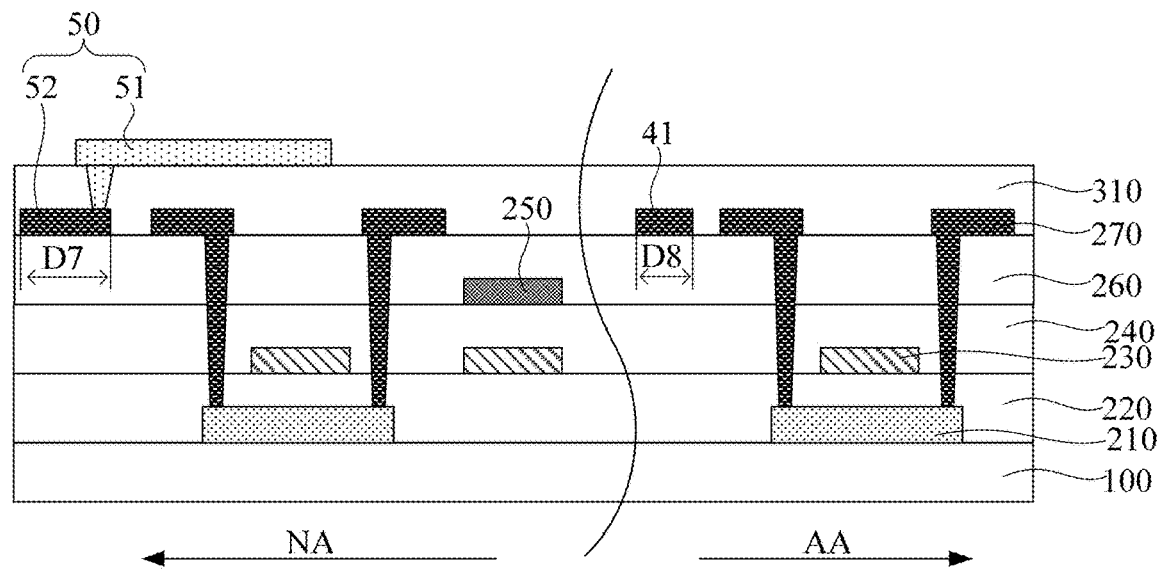

FIGS. 15 and 16 are each a diagram illustrating the structure of another display panel according to an embodiment of the present disclosure. With reference to FIG. 15 or 16, optionally, the display panel also includes a first power signal line 41. The first power signal bus (not shown in FIGS. 15 and 16) provides the first power signal V1 for the pixel circuit through the first power signal line 41. The first power signal line 41 is located in the display region AA of the display panel. The first power signal line 41 is located in the same layer as the second sub-signal line 52.

The first power signal line 41 is a PVDD signal line that provides the first power supply signal V1 for each pixel circuit. The PVDD signal line is generally disposed above the film where the transistor or the capacitor is located in the panel (in some embodiments, the PVDD signal line may be in the same layer as the source and drain metal layer) to facilitate wiring. In this embodiment, the second sub-signal line 52 is disposed in the same layer as the first power signal line 41, thereby simplifying the process.

Optionally, the width of the first sub-signal line 51 is larger than the width of the first power signal line 41. Moreover/Alternatively, the width of the second sub-signal line 52 is larger than or smaller than the width of the first power signal line 41.

The first power signal line 41 is a wire extending from the first power signal bus to the display region AA. Generally, a column and/or a row of light-emitting elements share one line. Accordingly, there are many interfaces of the first power signal 41 in the display panel, and the circuits in the display region AA are densely arranged. The voltage drop may also be avoided to a certain extent when the width of a wire is configured to be narrow. Second electrodes are usually laid in a whole layer in a large region of the panel and are connected to the second power signal bus only in the bezel region. To ensure the transmittance of the second electrode, the film thickness of the second electrode is relatively thin, and the voltage drop on the second electrode is often apparent. To sufficiently reduce the voltage drop on the second electrode, the width of the second power signal bus needs to be configured to be wide enough to reduce the resistance. In this manner, in this embodiment, the width of the first sub-signal line 51 may be configured to be wider than the width of the first power signal line 41, so that the resistance of a wire is reduced without increasing the bezel area.

In some embodiments, the second sub-signal line 52 does not overlap the driver circuit. If the width of the second sub-signal line 52 is large, the bezel area is large. In other embodiments, when each of the first sub-signal line 51 and the second sub-signal line 52 overlaps the driver circuit 10, the second sub-signal line 52 is more adjacent to the driver circuit than the first sub-signal line 51. To avoid signal crosstalk, the width of the second sub-signal line 52 is configured to be as small as possible. In this manner, the width D5 of the second sub-signal line 52 may be smaller than the width D6 of the first power signal line 41 (FIG. 15). In another embodiment, for example, in the case where the requirement for the resistance of the second power signal bus is relatively strict, the width D7 of the second sub-signal line 52 may also be configured to be wider than the width D8 of the first power signal line 41 (FIG. 16) to ensure that the resistance is small.

Figure 17:
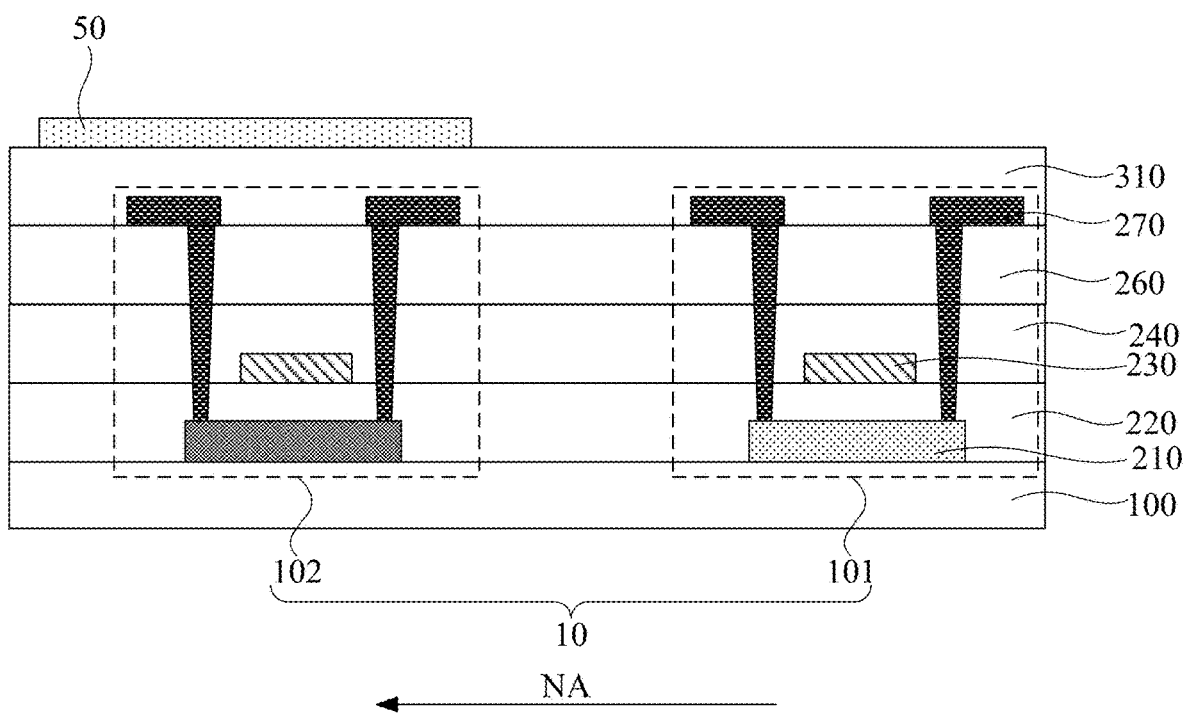
FIG. 17 is a diagram illustrating the structure of another display panel according to an embodiment of the present disclosure.

FIG. 17 is a diagram illustrating the structure of another display panel according to an embodiment of the present disclosure. With reference to FIG. 17, in an embodiment, optionally, the driver circuit 10 includes a first transistor 101 and a second transistor 102. The active layer of the first transistor 101 includes silicon. The active layer of the second transistor 102 includes an oxide semiconductor. The second power signal bus 50 covers the active layer of the second transistor 102. The second power signal bus 50 does not cover the active layer of the first transistor 101.

The active layer of the first transistor 101 may include low-temperature polycrystalline silicon (LTPS). The active layer of the second transistor 102 may include indium gallium zinc oxide (IGZO). The IGZO has the following characteristics over the LTPS: a high transmittance, low electron mobility, a large switching ratio, and low power consumption. The driver circuit formed by using the two kinds of transistors has a better performance. Since an oxide semiconductor active layer is more sensitive to molecules such as hydrogen and water than a silicon active layer, in this embodiment, the second power signal bus 50 also serves as the shielding layer of the oxide semiconductor active layer. In this manner, protection is provided for the oxide semiconductor active layer to avoid the failure of the oxide semiconductor active layer. During specific implementation, the pixel circuit may also include two kinds of transistors. For example, a drive module, a data write module, and a light emission control module in the pixel circuit adopt LTPS PMOS transistors. An initialization module and a threshold compensation module adopt IGZO NMOS transistors.

Optionally, the driver circuit includes a first driver circuit configured to provide a first control signal for the pixel circuit. The first driver circuit includes multiple stages of first shift registers cascaded with each other in a first direction. The display panel includes a first signal line group connected to the first driver circuit and configured to provide a signal for the first driver circuit. A first signal line in the first signal line group overlaps the first shift registers. In a second direction, the width of the overlapping region between the first shift registers and the first signal line is W11, the width of the overlapping region between the first shift registers and the second power signal bus is W12, and the second direction and the first direction intersect, where W11<W12.

The first direction may be the column direction Y of a pixel unit, and the second direction may be the row direction X of the pixel unit. The first control signal is an enable signal EMIT that controls the pixel circuit to emit light. The first driver circuit is an EMIT VSR circuit corresponding to the light emission control module in the pixel circuit. Since the second power signal bus is configured to provide a signal to the second electrodes laid in a whole layer in the display panel, the second power signal bus has a high requirement for the voltage drop and is required to have a sufficiently small resistance. For this reason, in this embodiment, W11<W12 is configured.

That is, in the case where the bezel area is not increased, the overlapping width of the second power signal bus and the driver circuit is increased as much as possible. In this manner, the voltage drop on the electrode is reduced as much as possible.

Optionally, the first signal line group includes a first clock signal line, and/or a second clock signal line, and/or a first voltage signal line, and/or a second voltage signal line. The first clock signal line is configured to provide a first clock signal for the first driver circuit. The second clock signal line is configured to provide a second clock signal for the first driver circuit. The first voltage signal line is configured to provide a first voltage signal for the first driver circuit. The second voltage signal line is configured to provide a second voltage signal for the first driver circuit. The second voltage signal is a low-level signal. The first signal line is one of the first clock signal line and the second clock signal line. Alternatively, the first signal line is one of the first voltage signal line and the second voltage signal line.

Figure 18:
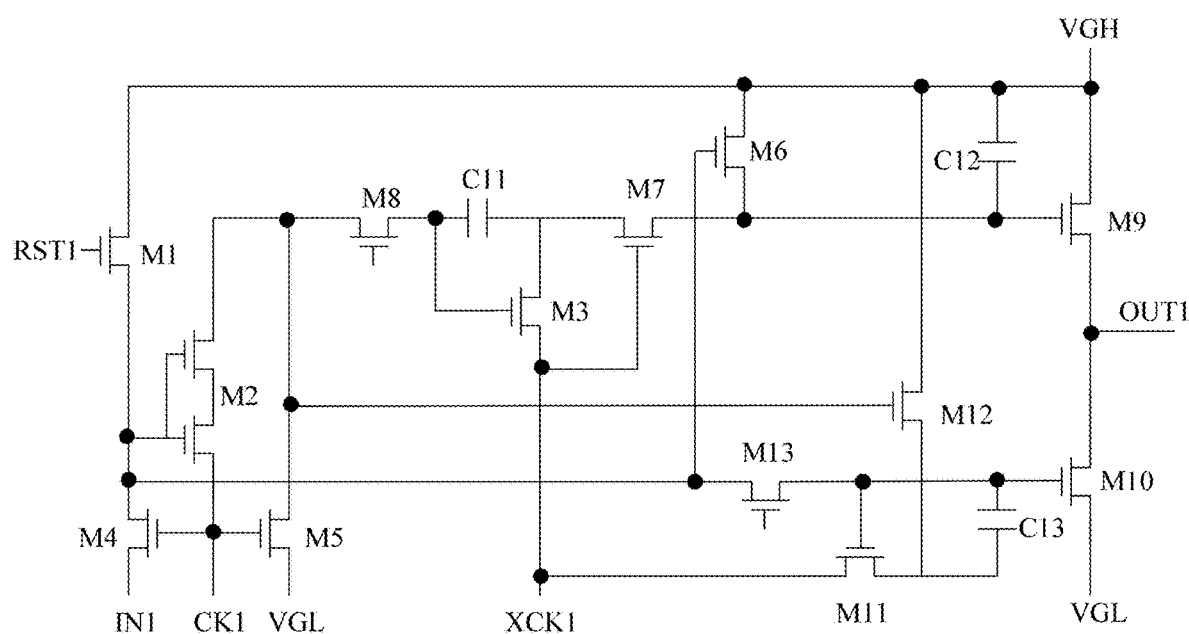
FIG. 18 is a diagram illustrating the circuit structure of a shift register according to an embodiment of the present disclosure.
Figure 19:
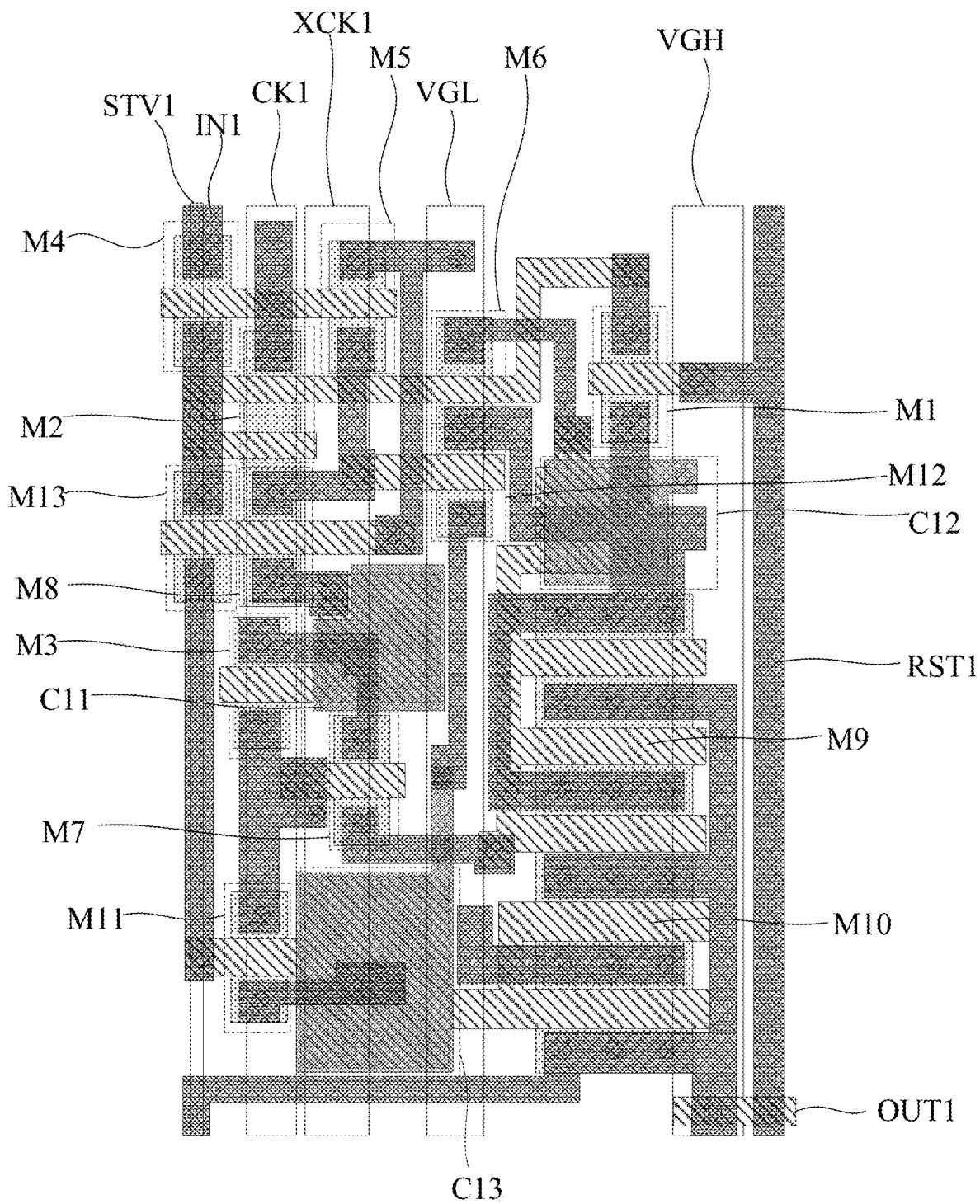
FIG. 19 is a structural layout of the shift register shown in FIG. 18.

For example, FIG. 18 is a diagram illustrating the circuit structure of a shift register according to an embodiment of the present disclosure. FIG. 19 is a structural layout of the shift register shown in FIG. 18. FIG. 18 may be a shift register in the first driver circuit. The shift register in the first driver circuit includes a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a first capacitor C11, a second capacitor C12, and a third capacitor C13. The first signal line group includes a start signal line STV1 (the start signal line STV1 provides a turn-on signal for a shift register at the end of cascaded shift registers in the first driver circuit), a clock signal line CK1, a clock signal line XCK1 (the phase of the pulse signal transmitted by the clock signal line CK1 and the phase of the pulse signal transmitted by the clock signal line XCK1 are reversed), a low-level voltage signal line VGL, and a high-level voltage signal line VGH. The first signal line group provides a signal for the shift register in the first driver circuit, and then through the cooperation of the first transistor M1 to the thirteenth transistor M13 and the first capacitor C11 to the third capacitor C13, the shift register finally outputs a light emission control signal that controls the operation of the light emission control transistor in the pixel circuit. The start signal line STV1, the clock signal line CK1, the clock signal line XCK1, the low-level voltage signal line VGL, and the high-level voltage signal line VGH provided by this embodiment of the present disclosure may each overlap the first driver circuit, that is, the first signal line includes a start signal line STV1, a clock signal line CK1, a clock signal line XCK1, a low-level voltage signal line VGL, and a high-level voltage signal line VGH. In this manner, it is ensured that the width of the border region of the display panel is small.

Optionally, in the second direction, the total width of the overlapping region between the signal line in the first signal line group and the first shift registers is WS1, where WS1<W12.

To configure a sufficient width for the second power signal bus and the overlapping area between the second power signal bus and the first driver circuit, part of the signal line in the first signal line group may be configured not to overlap the driver circuit, or the total width after overlapping is small, that is, WS1<W12 is satisfied. In this manner, the resistance on the second power signal bus is sufficiently reduced.

Optionally, the driver circuit also includes a second driver circuit configured to provide a second control signal for the pixel circuit. The second driver circuit includes multiple stages of second shift registers cascaded with each other. In the second direction, the width of the overlapping region between the second shift registers and the second power signal bus is W22, where W12>W22≥0.

The second power bus mainly overlaps the first driver circuit, and a small part of the second power bus overlaps the second driver circuit, or the second power bus does not overlap the second driver circuit. In this embodiment, the second driver circuit may be a driver circuit providing a control signal for an NMOS-type transistor and configured to provide a control signal for the initialization module and the threshold compensation module of the pixel circuit.

Optionally, the display panel includes a second signal line group connected to the second driver circuit and configured to provide a signal for the second driver circuit. In the second direction, the total width of the overlapping region between the signal line in the second signal line group and the second shift registers is WS2, where WS1<WS2.

Since the second power signal bus does not overlap the second driver circuit, or the overlapping width is small, WS1<WS2 may be configured, that is, the overlapping width of the signal line in the second signal line group and the second driver circuit is large. In this manner, a narrow bezel effect is implemented.

Optionally, the second signal line group includes a third clock signal line, and/or a fourth clock signal line, and/or a third voltage signal line, and/or a fourth voltage signal line. The third clock signal line is configured to provide a third clock signal for the second driver circuit. The fourth clock signal line is configured to provide a fourth clock signal for the second driver circuit. The third voltage signal line is configured to provide a third voltage signal for the second driver circuit. The third voltage signal is a low-level signal. The fourth voltage signal line is configured to provide a fourth voltage signal for the second driver circuit. The fourth voltage signal is a low-level signal.

Figure 20:
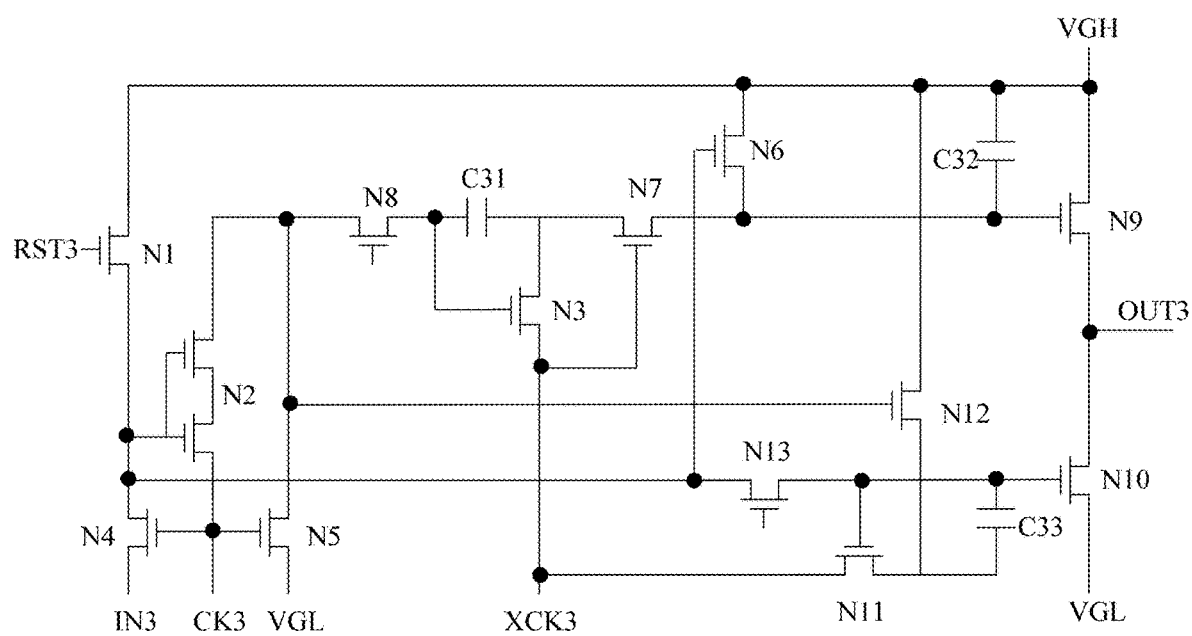
FIG. 20 is a diagram illustrating the circuit structure of another shift register according to an embodiment of the present disclosure.
Figure 21:
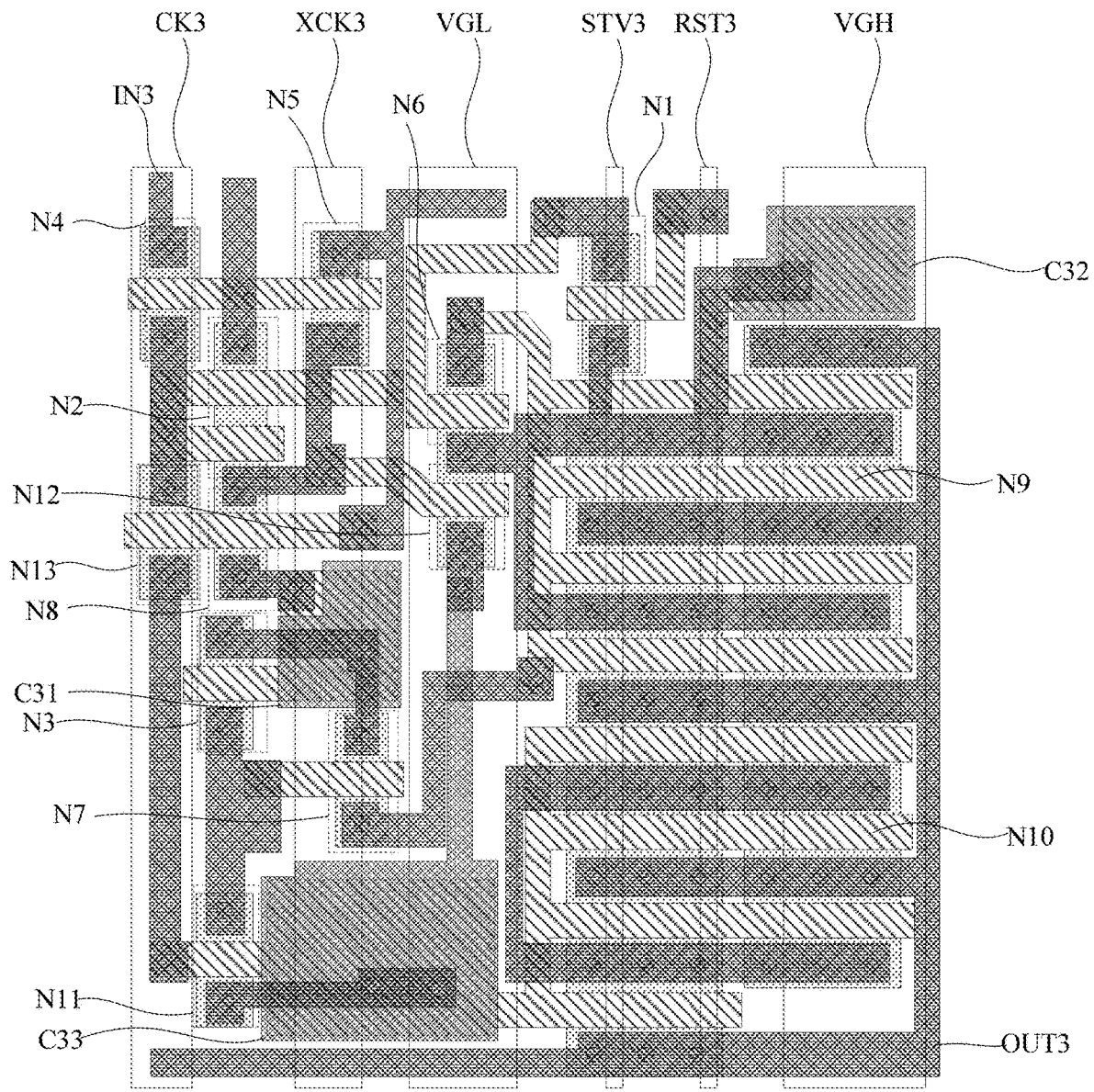
FIG. 21 is a structural layout of the shift register shown in FIG. 20.

For example, FIG. 20 is a diagram illustrating the circuit structure of another shift register according to an embodiment of the present disclosure. FIG. 21 is a structural layout of the shift register shown in FIG. 20. FIG. 20 may be a shift register in the second driver circuit. The second driver circuit is configured to control the NMOS-type transistor in the pixel circuit. The shift register in the second driver circuit includes a first transistor N1, a second transistor N2, a third transistor N3, a fourth transistor N4, a fifth transistor N5, a sixth transistor N6, a seventh transistor N7, an eighth transistor N8, a ninth transistor N9, a tenth transistor N10, an eleventh transistor N11, a twelfth transistor N12, a thirteenth transistor N13, a first capacitor C31, a second capacitor C32, and a third capacitor C33. The second signal line group includes a start signal line STV3 (the start signal line STV3 provides a turn-on signal for a shift register at the end of cascaded shift registers in the second driver circuit), a clock signal line CK3, a clock signal line XCK3 (the phase of the pulse signal transmitted by the clock signal line CK3 and the phase of the pulse signal transmitted by the clock signal line XCK3 are reversed), a low-level voltage signal line VGL, and a high-level voltage signal line VGH. The second signal line group provides a signal for the shift register in the second driver circuit, and then through the cooperation of the first transistor N1 to the thirteenth transistor N13 and the first capacitor C31 to the third capacitor C33, the shift register finally outputs a control signal that controls the operation of the NMOS-type transistor in the pixel circuit. The start signal line STV3, the clock signal line CK3, the clock signal line XCK3, the low-level voltage signal line VGL, and the high-level voltage signal line VGH provided by this embodiment of the present disclosure may each overlap the second driver circuit, that is, the second signal line includes a start signal line STV3, a clock signal line CK3, a clock signal line XCK3, a low-level voltage signal line VGL, and a high-level voltage signal line VGH. In this manner, it is ensured that the width of the border region of the display panel is small.

Optionally, the first clock signal line overlaps the first shift registers. The third clock signal line overlaps the second shift registers. The width of the first clock signal line is smaller than the width of the third clock signal line. Alternatively, the second clock signal line overlaps the first shift registers. The fourth clock signal line overlaps the second shift registers. The width of the second clock signal line is smaller than the width of the fourth clock signal line.

Optionally, the first voltage signal line overlaps the first shift registers. The third voltage signal line overlaps the second shift registers. The width of the first voltage signal line is smaller than the width of the third voltage signal line. Alternatively, the second voltage signal line overlaps the first shift registers. The fourth voltage signal line overlaps the second shift registers. The width of the second voltage signal line is smaller than the width of the fourth voltage signal line.

In this embodiment, since the overlapping area of the first driver circuit and the second power signal bus is larger than the overlapping area of the second driver circuit and the second power signal bus, the width of the wire in the first signal line group overlapping the first driver circuit is configured to be smaller than the width of the wire having the same function in the second signal line group overlapping the second driver circuit to provide a sufficient space for the second power signal bus to ensure the width of the second power signal bus and reduce the resistance.

Figure 22:
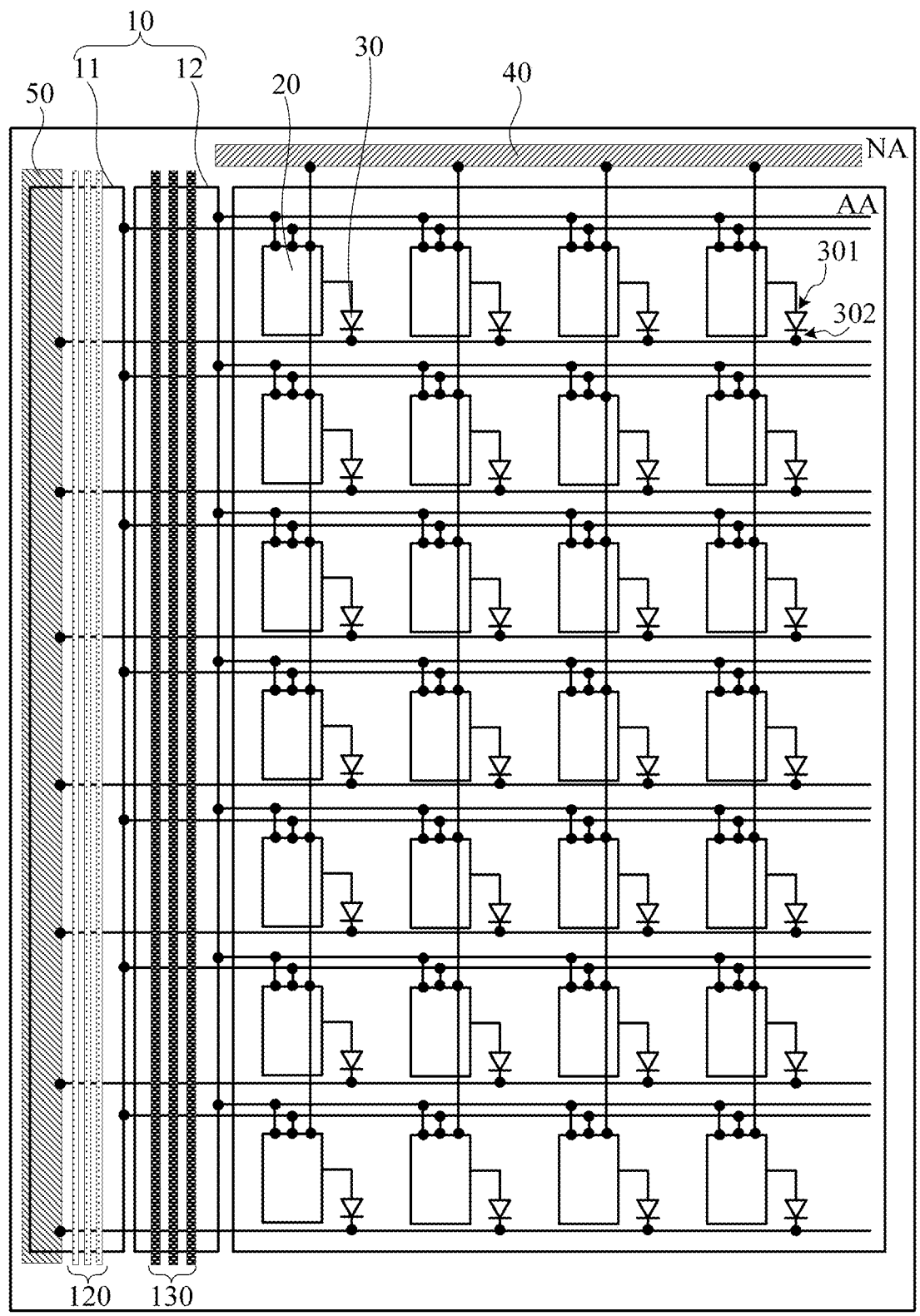
FIG. 22 is a diagram illustrating the structure of another display panel according to an embodiment of the present disclosure.

For example, FIG. 22 is a diagram illustrating the structure of another display panel according to an embodiment of the present disclosure. With reference to FIG. 22, the width of the signal line in the first signal line group 120 overlapping the first driver circuit 11 is smaller than the width of the corresponding signal line transmitting the same signal in the second signal line group 130 overlapping the second driver circuit 20.

With continued reference to FIG. 22, optionally, the second driver circuit 12 is located on the side of the first driver circuit 11 facing the display region AA of the display panel.

The second driver circuit 12 is configured to be located on the side of the first driver circuit 11 facing the display region AA, so that it is convenient to connect two layers of wires in the second power signal bus through a via. Accordingly, the second power signal bus is generally configured to overlap a driver circuit farthest from the display region AA, so that after the second power signal bus extends out of the driver circuit, a punching connection may be facilitated.

Optionally, the driver circuit also includes a third driver circuit configured to provide a third control signal for the pixel circuit. The third driver circuit includes multiple stages of third shift registers cascaded with each other. In the second direction, the width of the overlapping region between the third shift registers and the second power signal bus is W32, where W12>W22≥W32≥0, or W12≥W22≥W32≥0.

The second power bus mainly overlaps the first driver circuit and may partially or may not overlap the second driver circuit and/or the third driver circuit. In this embodiment, the third driver circuit may be a driver circuit providing a control signal for a PMOS-type transistor and configured to provide a control signal for the data write module or the light emission control module of the pixel circuit.

Figure 23:
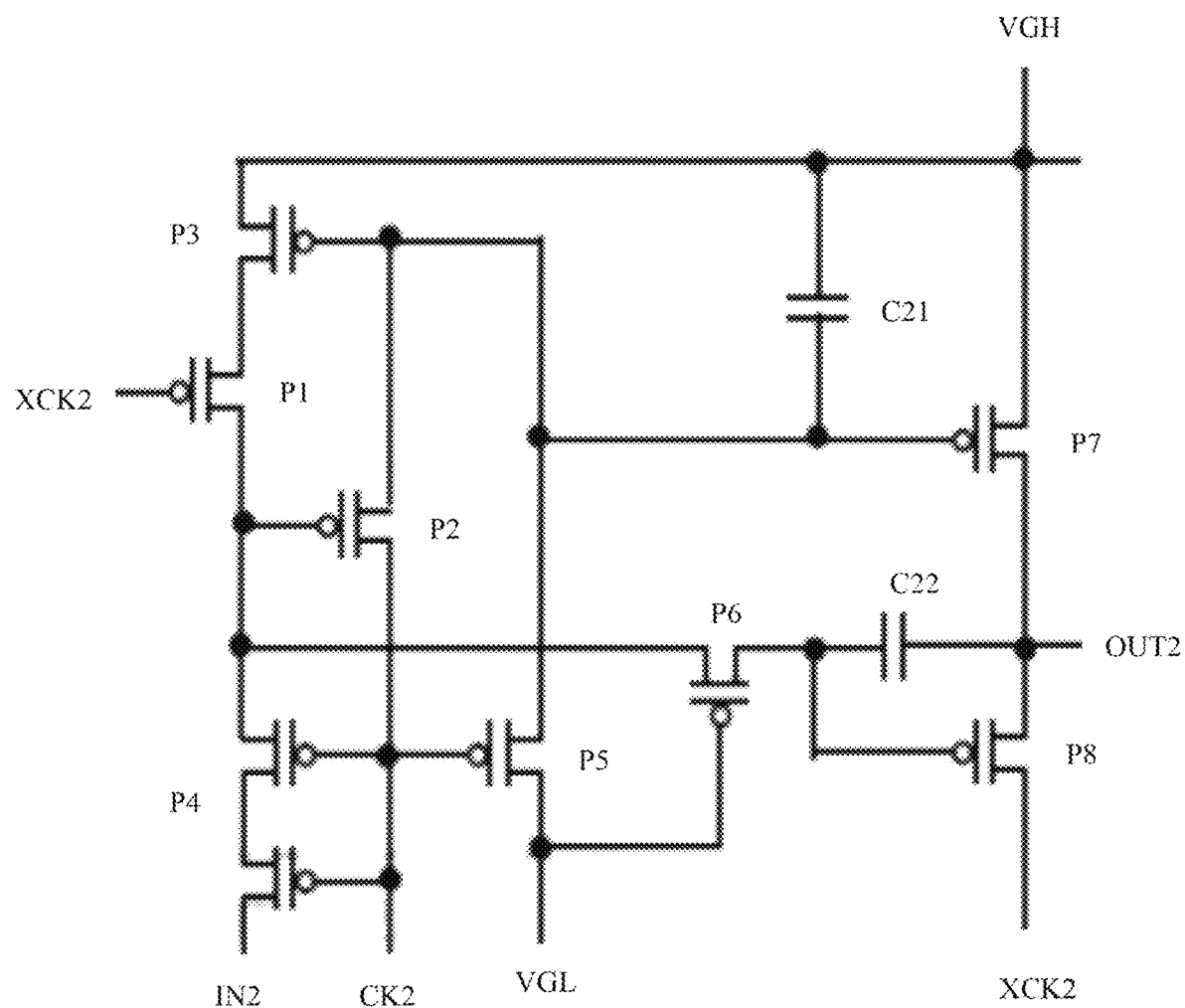
FIG. 23 is a diagram illustrating the circuit structure of another shift register according to an embodiment of the present disclosure.
Figure 24:
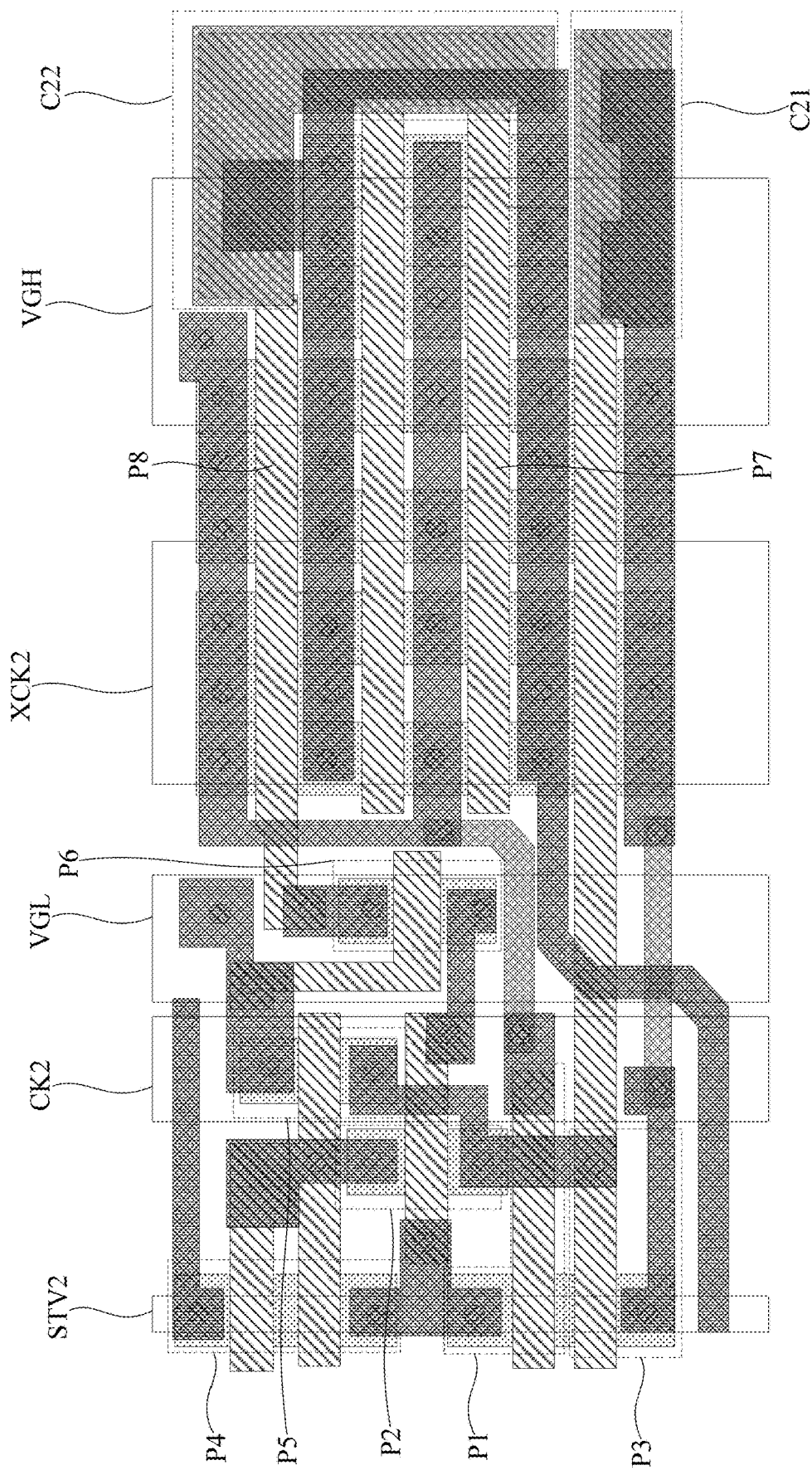
FIG. 24 is a structural layout of the shift register shown in FIG. 23.

FIG. 23 is a diagram illustrating the circuit structure of another shift register according to an embodiment of the present disclosure. FIG. 24 is a structural layout of the shift register shown in FIG. 23. FIG. 23 may be a shift register in the third driver circuit. The third driver circuit is configured to control the PMOS-type transistor in the pixel circuit. The shift register in the third driver circuit includes a first transistor P1, a second transistor P2, a third transistor P3, a fourth transistor P4, a fifth transistor P5, a sixth transistor P6, a seventh transistor P7, an eighth transistor P8, a first capacitor C21, and a second capacitor C22. The second signal line group includes a start signal line STV2 (the start signal line STV2 provides a turn-on signal for a shift register at the end of cascaded shift registers in the third driver circuit), a clock signal line CK2, a clock signal line XCK2, a low-level voltage signal line VGL, and a high-level voltage signal line VGH. The second signal line group provides the signal for the shift register in the second driver circuit, and then through the cooperation of the first transistor P1 to the eighth transistor P8 and the first capacitor C21 and the second capacitor C22, the shift register finally outputs a control signal that controls the operation of the PMOS-type transistor in the pixel circuit. The start signal line STV2, the clock signal line CK2, the clock signal line XCK2 (the phase of the pulse signal transmitted by the clock signal line CK2 and the phase of the pulse signal transmitted by the clock signal line XCK2 are reversed), the low-level voltage signal line VGL, and the high-level voltage signal line VGH provided by this embodiment of the present disclosure may each overlap the third driver circuit, that is, the third signal line includes a start signal line STV2, a clock signal line CK2, a clock signal line XCK2, a low-level voltage signal line VGL, and a high-level voltage signal line VGH. In this manner, it is ensured that the width of the border region of the display panel is small.

Optionally, the display panel includes a third signal line group connected to the third driver circuit and configured to provide a signal for the third driver circuit. In the second direction, the total width of the overlapping region between the signal line in the third signal line group and the third shift registers is WS3, where WS1<WS3.

Similar to the disposition of the second driver circuit, since the second power signal bus does not overlap the third driver circuit, or the overlapping width is small, WS1<WS3 may be configured, that is, the overlapping width of the signal line in the third signal line group and the third driver circuit is large. In this manner, the narrow bezel effect is implemented.

Figure 25:
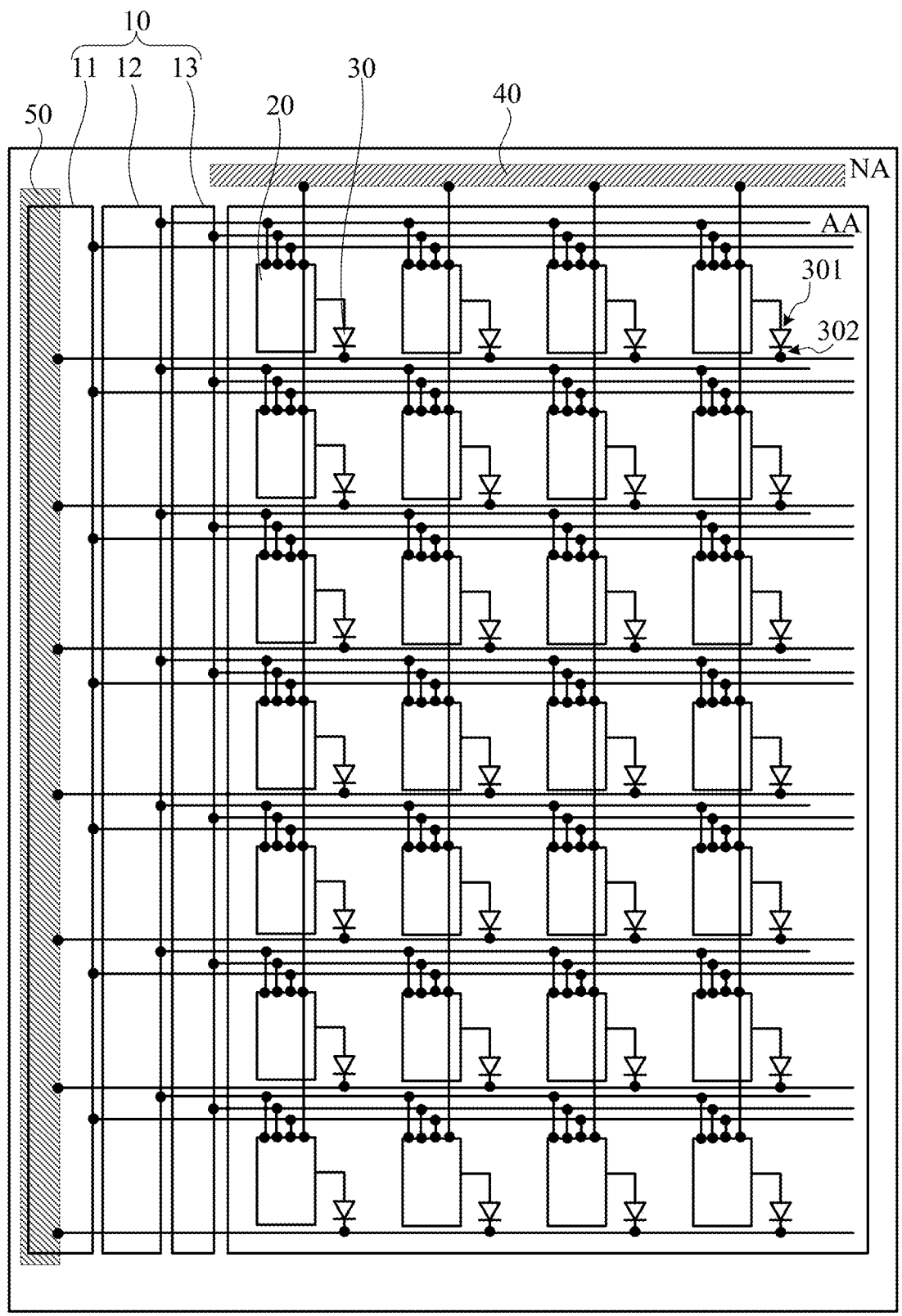
FIG. 25 is a diagram illustrating the structure of another display panel according to an embodiment of the present disclosure.

FIG. 25 is a diagram illustrating the structure of another display panel according to an embodiment of the present disclosure. With reference to FIG. 25, optionally, the second driver circuit 12 is located on the side of the first driver circuit 11 facing the display region AA of the display panel. The third driver circuit 13 is located on the side of the second driver circuit 12 facing the display region AA of the display panel. That is, the first driver circuit 11, the second driver circuit 12, and the third driver circuit 13 are sequentially arranged along the edge of the display panel towards the display region. In this manner, the design of the second power signal bus is facilitated to obtain a smaller bezel.

It is to be noted that FIGS. 22 and 25 show only a manner of unilateral driving similar to the manner in FIG. 1. In other embodiments, a manner similar to the manner of bilateral driving shown in FIGS. 2 and 3 may also be performed.

Figure 26:
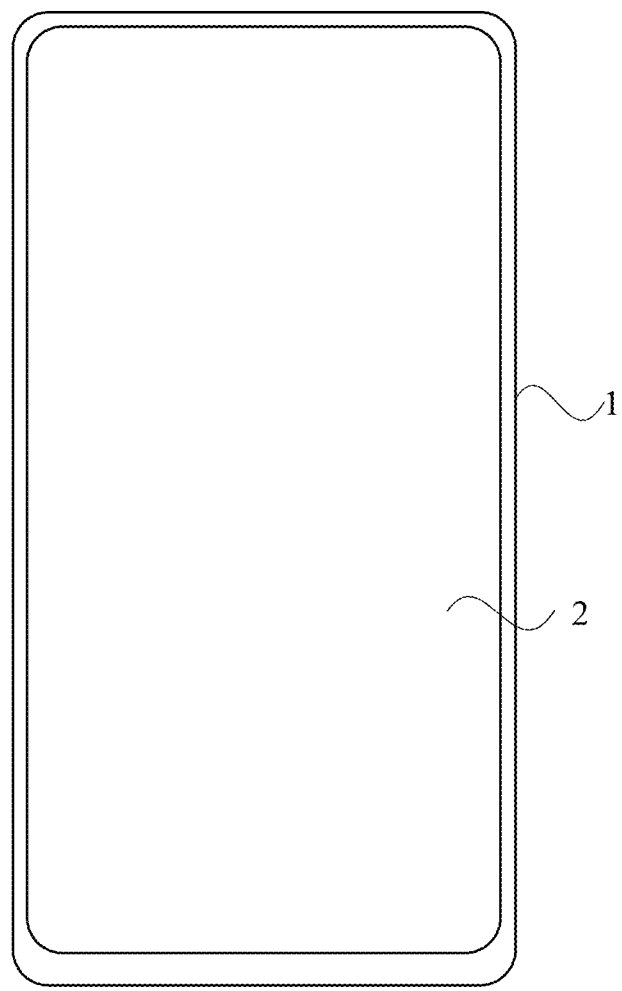
FIG. 26 is a diagram illustrating the structure of a display device according to an embodiment of the present disclosure.

FIG. 26 is a diagram illustrating the structure of a display device according to an embodiment of the present disclosure. With reference to FIG. 26, the display device 1 includes any display panel 2 provided in the embodiments of the present disclosure. The display device 1 may be a mobile phone, a computer, and a smart wearable device.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
  a driver circuit and a pixel circuit, wherein the driver circuit provides a drive signal for the pixel circuit;

a light-emitting element, wherein the light-emitting element comprises a first electrode and a second electrode; and a first power signal bus and a second power signal bus, wherein the first power signal bus is configured to transmit a first power signal V1, the second power signal bus is configured to transmit a second power signal V2, and V1≠V2;

wherein the first power signal bus is connected to the pixel circuit, the pixel circuit is connected to the first electrode; and the second power signal bus at least partially overlaps the driver circuit, and the second power signal bus is not connected to the driver circuit;

wherein the driver circuit comprises a first driver circuit configured to provide a first control signal for the pixel circuit, and the first driver circuit comprises a plurality of stages of first shift registers cascaded with each other in a first direction;

wherein the display panel further comprises a first signal line group connected to the first driver circuit and configured to provide a signal for the first driver circuit, and a first signal line in the first signal line group overlaps a first shift register of the plurality of stages of the first shift registers; and the first signal line group does not comprise the second power signal bus; and wherein the display panel further comprises an auxiliary connection layer and the driver circuit further comprises a second driver circuit configured to provide a second control signal for the pixel circuit;

the auxiliary connection layer is located between a film where the second electrode is located and a film where the second power signal bus is located, and the second power signal bus is connected to the auxiliary connection layer and is connected to the second electrode through the auxiliary connection layer;

in a second direction, a width of an overlapping region between the first shift register and the first signal line is W11, a width of an overlapping region between the first shift register and the second power signal bus is W12, and the second direction and the first direction intersect, wherein W11<W12;

the second driver circuit comprises a plurality of stages of second shift registers cascaded with each other in the first direction, the second driver circuit is located on a side of the first driver circuit facing a display region of the display panel, and the second drive circuit is located on a same side of the display region as the first drive circuit; and in the second direction, a width of an overlapping region between a second shift register of the plurality of stages of the second shift registers and the second power signal bus is W22, wherein W12>W22≥0.

2. The display panel according to claim 1, wherein the second power signal bus comprises a first sub-signal line and a second sub-signal line, the first sub-signal line and the second sub-signal line are disposed in different layers, and the first sub-signal line is connected to the second sub-signal line through a first via.

3. The display panel according to claim 2, wherein the first sub-signal line at least partially overlaps the driver circuit, and the second sub-signal line does not overlap the driver circuit; and a width of the first sub-signal line is larger than a width of the second sub-signal line.

4. The display panel according to claim 3, wherein the first sub-signal line comprises a first region and a second region, wherein the first region overlaps the driver circuit, the second region does not overlap the driver circuit, and the second region is located on a side of the first region facing away from display region of the display panel; and the second region overlaps the second sub-signal line, the second region is connected to the second sub-signal line through the first via, and the first via does not overlap the driver circuit.

5. The display panel according to claim 3, wherein the second sub-signal line is located on a side of a film where the first sub-signal line is located facing the driver circuit; and the driver circuit comprises a first transistor and/or a first capacitor, wherein at least one film of the first transistor is located in a same layer as the second sub-signal line.

6. The display panel according to claim 1, wherein the first signal line group comprises:

a first clock signal line configured to provide a first clock signal for the first driver circuit; and/or a second clock signal line configured to provide a second clock signal for the first driver circuit; and/or a first voltage signal line configured to provide a first voltage signal for the first driver circuit, wherein the first voltage signal is a high-level signal; and/or a second voltage signal line configured to provide a second voltage signal for the first driver circuit, wherein the second voltage signal is a low-level signal, wherein the first signal line is one of the first clock signal line and the second clock signal line; or the first signal line is one of the first voltage signal line and the second voltage signal line.

7. The display panel according to claim 1, wherein at least one signal line of the first signal line group overlaps a first shift register of the plurality of stages of the first shift registers; and in the second direction, a total width of an overlapping region between the whole of the at least one signal line in the first signal line group and the first shift register is WS1, wherein

WS1<W12.

8. The display panel according to claim 1, further comprising:

a second signal line group connected to the second driver circuit and configured to provide a signal for the second driver circuit, wherein at least one signal line of the first signal line group overlaps a first shift register of the plurality of stages of the first shift registers; and in the second direction, a total width of an overlapping region between the whole of the at least one signal line in the first signal line group and the first shift register is WS1;

at least one signal line of the second signal line group overlaps a second shift register of the plurality of stages of the second shift registers; and in the second direction, a total width of an overlapping region between the whole of the at least one signal line in the second signal line group and the second shift register is WS2, wherein

WS1<WS2.

9. The display panel according to claim 8, wherein
the second signal line group comprises:
a third clock signal line configured to provide a third clock signal for the second driver circuit; and/or
a fourth clock signal line configured to provide a fourth clock signal for the second driver circuit; and/or
a third voltage signal line configured to provide a third voltage signal for the second driver circuit, wherein the third voltage signal is a high-level signal; and/or
a fourth voltage signal line configured to provide a fourth voltage signal for the second driver circuit, wherein the fourth voltage signal is a low-level signal.

10. The display panel according to claim 9, wherein
the first voltage signal line overlaps the first shift register, and the third voltage signal line overlaps the second shift register, wherein a width of the first voltage signal line is smaller than a width of the third voltage signal line; or
the second voltage signal line overlaps the first shift register, and the fourth voltage signal line overlaps the second shift register, wherein a width of the second voltage signal line is smaller than a width of the fourth voltage signal line.

11. The display panel according to claim 1, wherein
the driver circuit further comprises a third driver circuit configured to provide a third control signal for the pixel circuit, and the third driver circuit comprises a plurality of stages of third shift registers cascaded with each other; and
in the second direction, a width of an overlapping region between a third shift register of the plurality of stages of the third shift registers and the second power signal bus is W32, wherein $$W12 > W22 \geq W32 \geq 0,$$

or $W12 \geq W22 > W32 \geq 0$.

12. The display panel according to claim 11, further comprising:
a third signal line group connected to the third driver circuit and configured to provide a signal for the third driver circuit, wherein in the second direction, a total width of an overlapping region between a signal line in the third signal line group and the third shift register is WS3, wherein $$WS1 < WS3.$$

13. The display panel according to claim 11, wherein
the third driver circuit is located on a side of the second driver circuit facing the display region of the display panel.

14. A display device, comprising a display panel according to claim 1.

15. A display panel, comprising:
a driver circuit and a pixel circuit, wherein the driver circuit provides a drive signal for the pixel circuit;
a light-emitting element, wherein the light-emitting element comprises a first electrode and a second electrode; and
a first power signal bus and a second power signal bus, wherein the first power signal bus is configured to transmit a first power signal V1, the second power signal bus is configured to transmit a second power signal V2, and V1≠V2;
wherein the first power signal bus is connected to the pixel circuit, the pixel circuit is connected to the first electrode; and the second power signal bus at least partially overlaps the driver circuit;
wherein the driver circuit comprises a first driver circuit configured to provide a first control signal for the pixel circuit, and the first driver circuit comprises a plurality of stages of first shift registers cascaded with each other in a first direction;
wherein the display panel further comprises a first signal line group connected to the first driver circuit and configured to provide a signal for the first driver circuit, and a first signal line in the first signal line group overlaps a first shift register of the plurality of stages of the first shift registers; and
the first signal line group at least comprises:
a first voltage signal line configured to provide a first voltage signal VGH for the first driver circuit, wherein the first voltage signal is a high-level signal; and/or
a second voltage signal line configured to provide a second voltage signal VGL for the first driver circuit, wherein the second voltage signal is a low-level signal,
the second power signal bus is neither the first voltage signal line nor the second voltage signal, and the second power signal bus is not connected to the driver circuit; and
wherein the display panel further comprises an auxiliary connection layer and the driver circuit further comprises a second driver circuit configured to provide a second control signal for the pixel circuit;
the auxiliary connection layer is located between a film where the second electrode is located and a film where the second power signal bus is located, and the second power signal bus is connected to the auxiliary connection layer and is connected to the second electrode through the auxiliary connection layer;
in a second direction, a width of an overlapping region between the first shift register and the first signal line is W11, a width of an overlapping region between the first shift register and the second power signal bus is W12, and the second direction and the first direction intersect, wherein W11<W12;
the second driver circuit comprises a plurality of stages of second shift registers cascaded with each other in the first direction, the second driver circuit is located on a side of the first driver circuit facing a display region of the display panel, and the second drive circuit is located on a same side of the display region as the first drive circuit; and
in the second direction, a width of an overlapping region between a second shift register of the plurality of stages of the second shift registers and the second power signal bus is W22, wherein W12>W22≥0.

16. A display device comprising a display panel according to claim 15.

17. A display panel, comprising:
a driver circuit and a pixel circuit, wherein the driver circuit provides a drive signal for the pixel circuit;
a light-emitting element, wherein the light-emitting element comprises a first electrode and a second electrode; and
a first power signal bus and a second power signal bus, wherein the first power signal bus is configured to transmit a first power signal V1, the second power signal bus is configured to transmit a second power signal V2, and V1≠V2;
wherein the first power signal bus is connected to the pixel circuit, the pixel circuit is connected to the first electrode; and the second power signal bus at least partially overlaps the driver circuit, and the second power signal bus is not connected to the driver circuit;

wherein the driver circuit comprises a first driver circuit configured to provide a first control signal for the pixel circuit, and the first driver circuit comprises a plurality of stages of first shift registers cascaded with each other in a first direction;

wherein the display panel further comprises a first signal line group connected to the first driver circuit and configured to provide a signal for the first driver circuit; and at least one signal line of the first signal line group overlaps a first shift register of the plurality of stages of the first shift registers; and wherein the display panel further comprises an auxiliary connection layer and the driver circuit further comprises a second driver circuit configured to provide a second control signal for the pixel circuit;

the auxiliary connection layer is located between a film where the second electrode is located and a film where the second power signal bus is located, and the second power signal bus is connected to the auxiliary connection layer and is connected to the second electrode through the auxiliary connection layer;

in the second direction, a total width of an overlapping region between the whole of the at least one signal line in the first signal line group and the first shift register is WS1, a width of an overlapping region between the first shift register and the second power signal bus is W12, and the second direction and the first direction intersect, wherein WS1<W12;

the second driver circuit comprises a plurality of stages of second shift registers cascaded with each other in the first direction, the second driver circuit is located on a side of the first driver circuit facing a display region of the display panel, and the second drive circuit is located on a same side of the display region as the first drive circuit; and in the second direction, a width of an overlapping region between a second shift register of the plurality of stages of the second shift registers and the second power signal bus is W22, wherein W12>W22>0.

18. A display device comprising a display panel according to claim 17.

* * * * *